United States Patent
Baek

(10) Patent No.: US 11,791,325 B2
(45) Date of Patent: Oct. 17, 2023

(54) SEMICONDUCTOR PACKAGE INCLUDING INTERPOSER

(71) Applicant: SAMSUNG ELECTRONICS CO., LTD., Suwon-si (KR)

(72) Inventor: Kiwon Baek, Yongin-si (KR)

(73) Assignee: SAMSUNG ELECTRONICS CO, LTD., Suwon-si (KR)

( * ) Notice: Subject to any disclaimer, the term of this patent is extended or adjusted under 35 U.S.C. 154(b) by 103 days.

(21) Appl. No.: 17/183,299

(22) Filed: Feb. 23, 2021

(65) Prior Publication Data
US 2022/0028848 A1 Jan. 27, 2022

(30) Foreign Application Priority Data
Jul. 27, 2020 (KR) .................. 10-2020-0093027

(51) Int. Cl.
*H01L 25/18* (2023.01)
*H01L 23/498* (2006.01)
*H01L 23/538* (2006.01)
*H01L 23/00* (2006.01)

(52) U.S. Cl.
CPC ........ *H01L 25/18* (2013.01); *H01L 23/49822* (2013.01); *H01L 23/5383* (2013.01); *H01L 24/16* (2013.01); *H01L 2224/16147* (2013.01); *H01L 2224/16165* (2013.01)

(58) Field of Classification Search
CPC ............... H01L 25/18; H01L 23/49822; H01L 23/5383; H01L 24/16; H01L 2224/16147; H01L 2224/16165
See application file for complete search history.

(56) References Cited

U.S. PATENT DOCUMENTS

| | | | |
|---|---|---|---|
| 9,496,042 B1 * | 11/2016 | Abiko | G11C 16/26 |
| 9,507,739 B2 | 11/2016 | Rajan et al. | |
| 9,851,401 B2 | 12/2017 | Kim et al. | |
| 10,002,835 B2 | 6/2018 | Fasano et al. | |
| 10,573,368 B2 | 2/2020 | Biswas et al. | |
| 10,916,489 B1 * | 2/2021 | Nishioka | G11C 5/06 |
| 2016/0048466 A1 | 2/2016 | Rajan et al. | |
| 2016/0111406 A1 | 4/2016 | Mak | |
| 2017/0146598 A1 | 5/2017 | Kim et al. | |
| 2017/0148737 A1 | 5/2017 | Fasano et al. | |
| 2018/0026013 A1 * | 1/2018 | Yun | G11C 29/26 257/48 |
| 2019/0102330 A1 * | 4/2019 | Hasbun | G11C 5/063 |
| 2019/0198083 A1 | 6/2019 | Biswas et al. | |

(Continued)

*Primary Examiner* — Benjamin Tzu-Hung Liu
(74) *Attorney, Agent, or Firm* — F. CHAU & ASSOCIATES, LLC

(57) ABSTRACT

A semiconductor package includes a processor, a lower memory including a plurality of lower memory chips that are vertically stacked, an interposer mounted on the processor and the lower memory, and an upper memory mounted on the interposer, the upper memory including a plurality of upper memory chips that are vertically stacked. The interposer includes a first physical layer (PHY) transmitting and receiving a signal between the processor and the lower memory and transmitting and receiving a signal between the processor and the upper memory, and the processor includes a second PHY communicating with the first PHY and a first through silicon via (TSV) electrically connecting the first PHY to the second PHY.

19 Claims, 33 Drawing Sheets

(56) References Cited

U.S. PATENT DOCUMENTS

| | | |
|---|---|---|
| 2019/0303042 A1 | 10/2019 | Kim et al. |
| 2020/0006299 A1* | 1/2020 | Liu .................. H01L 23/49827 |
| 2020/0343218 A1* | 10/2020 | Hu .......................... H01L 24/80 |

* cited by examiner

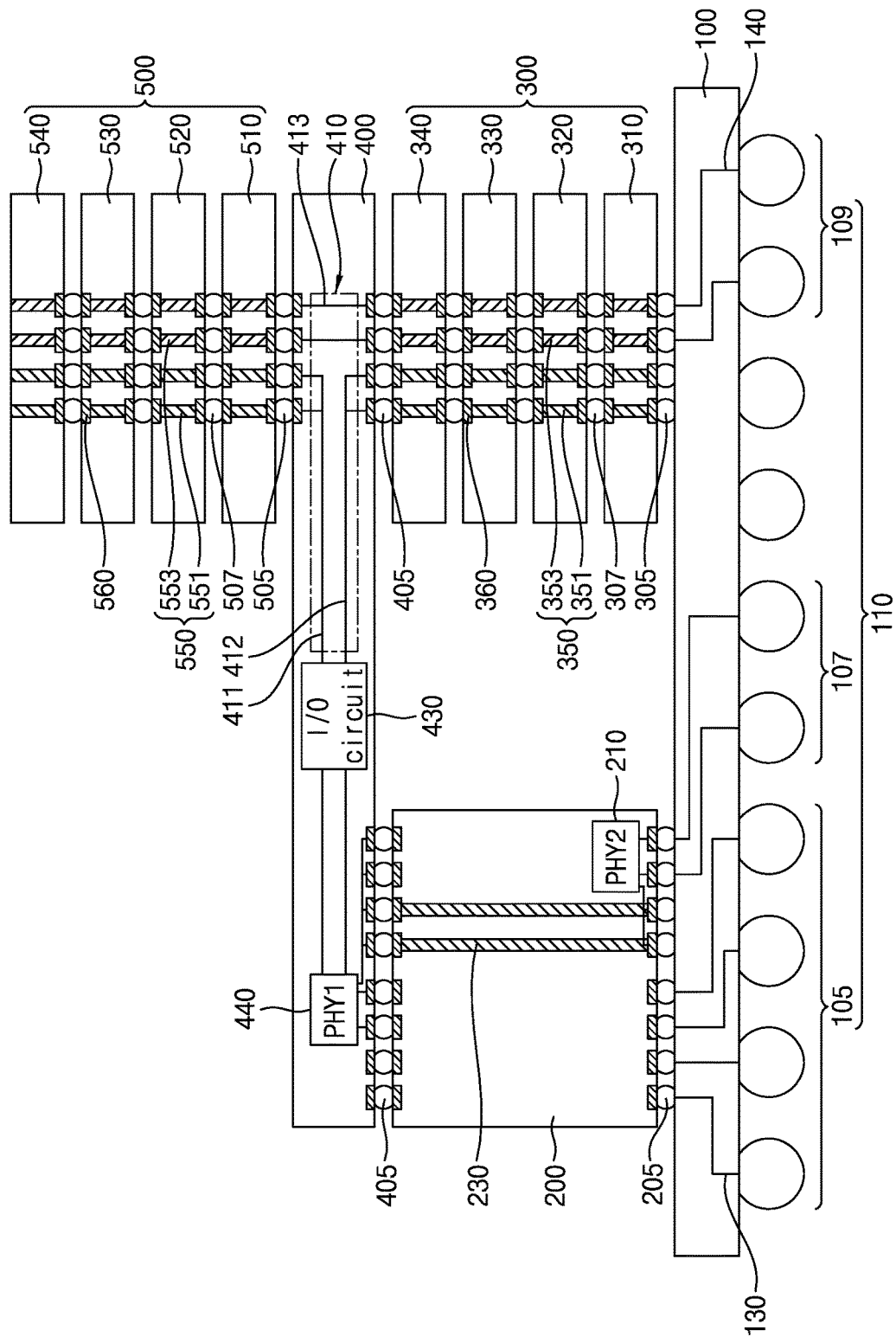

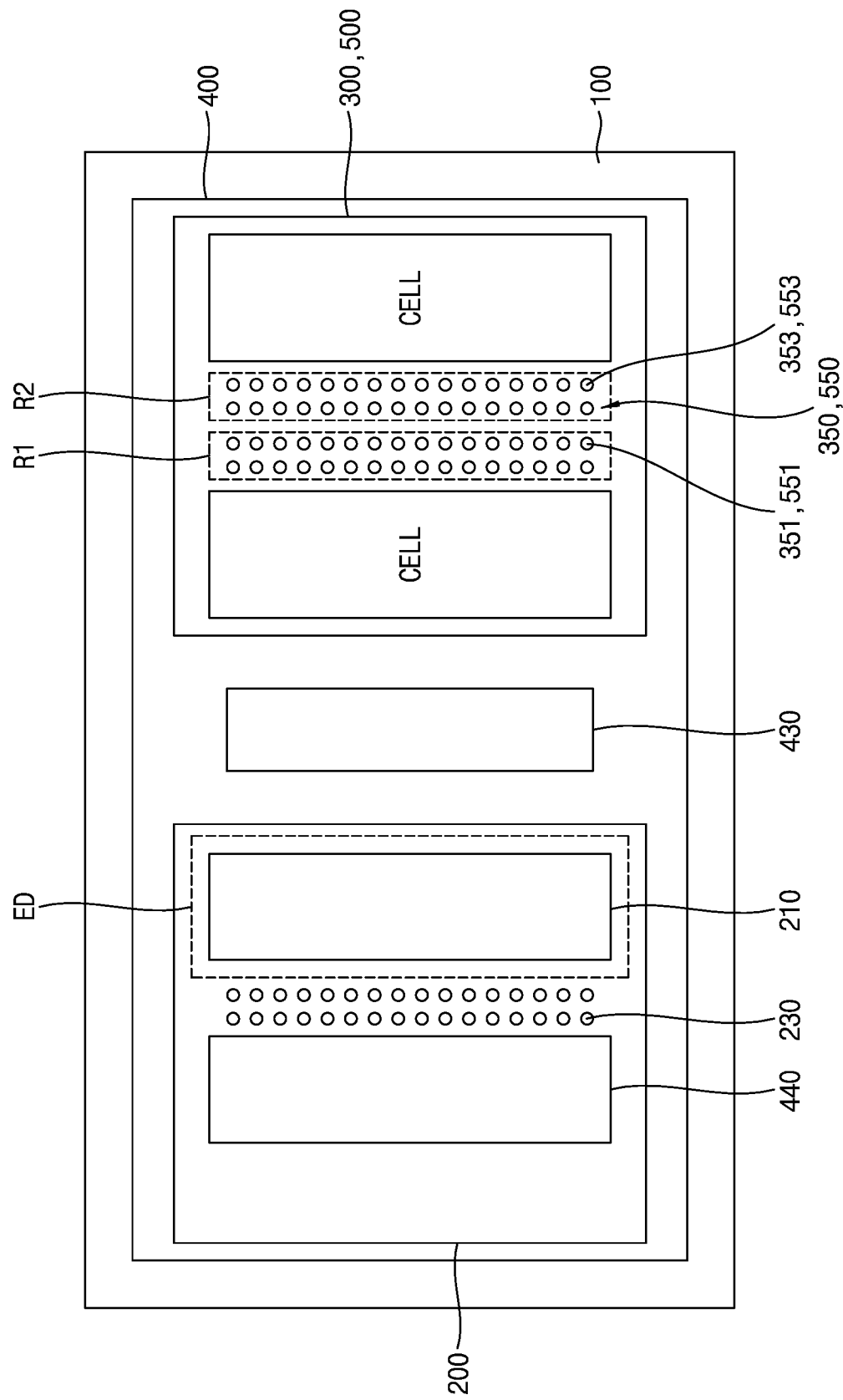

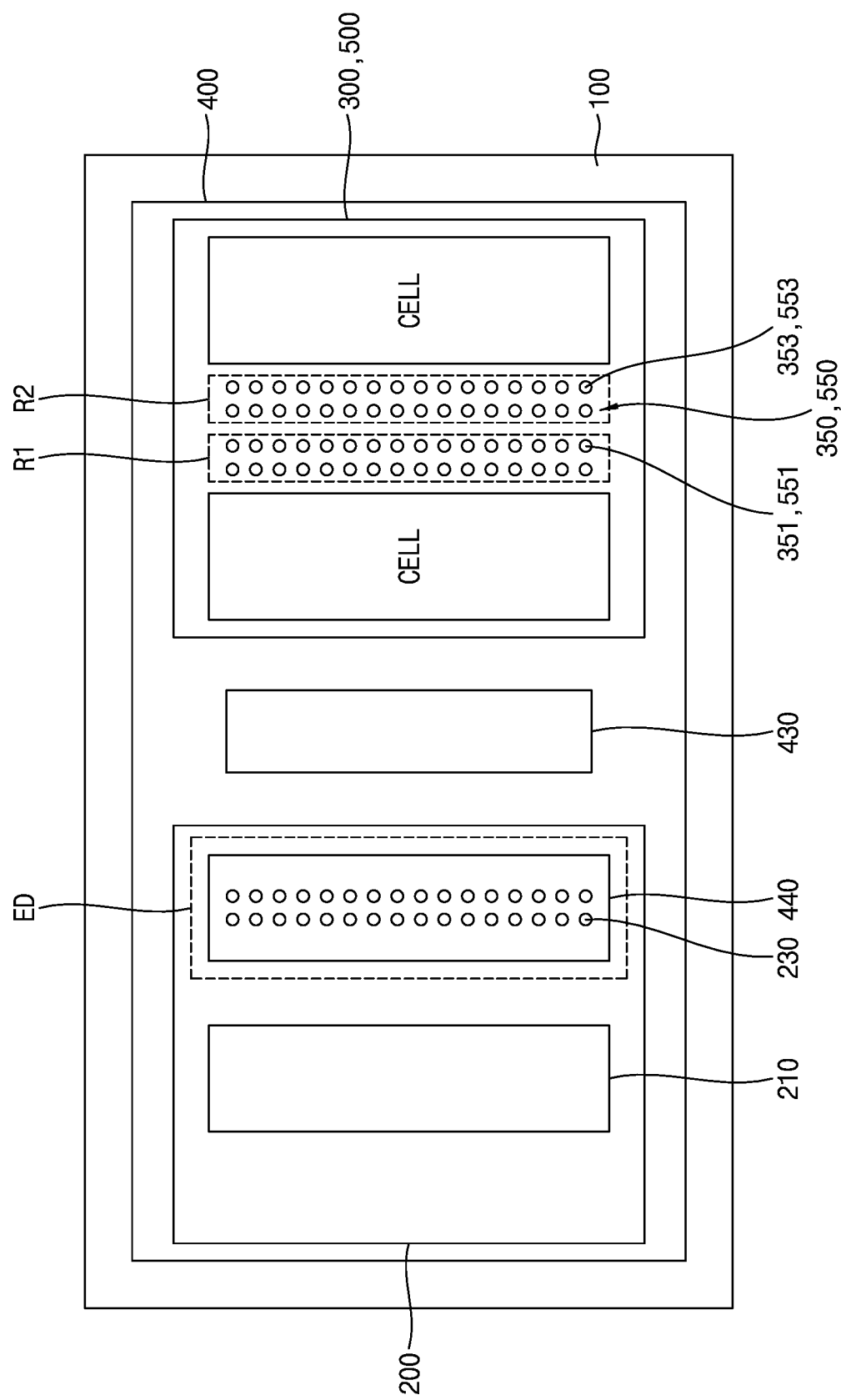

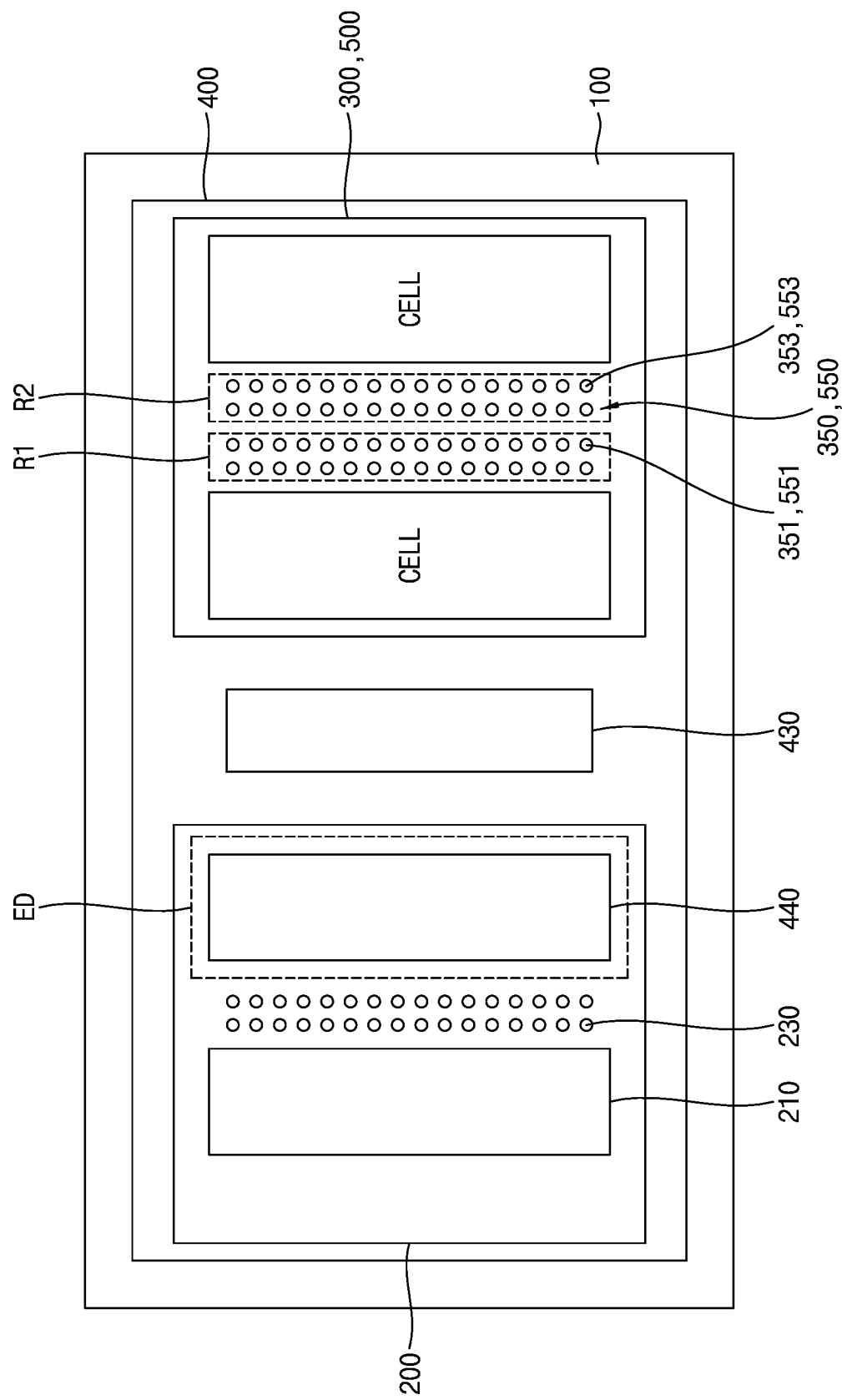

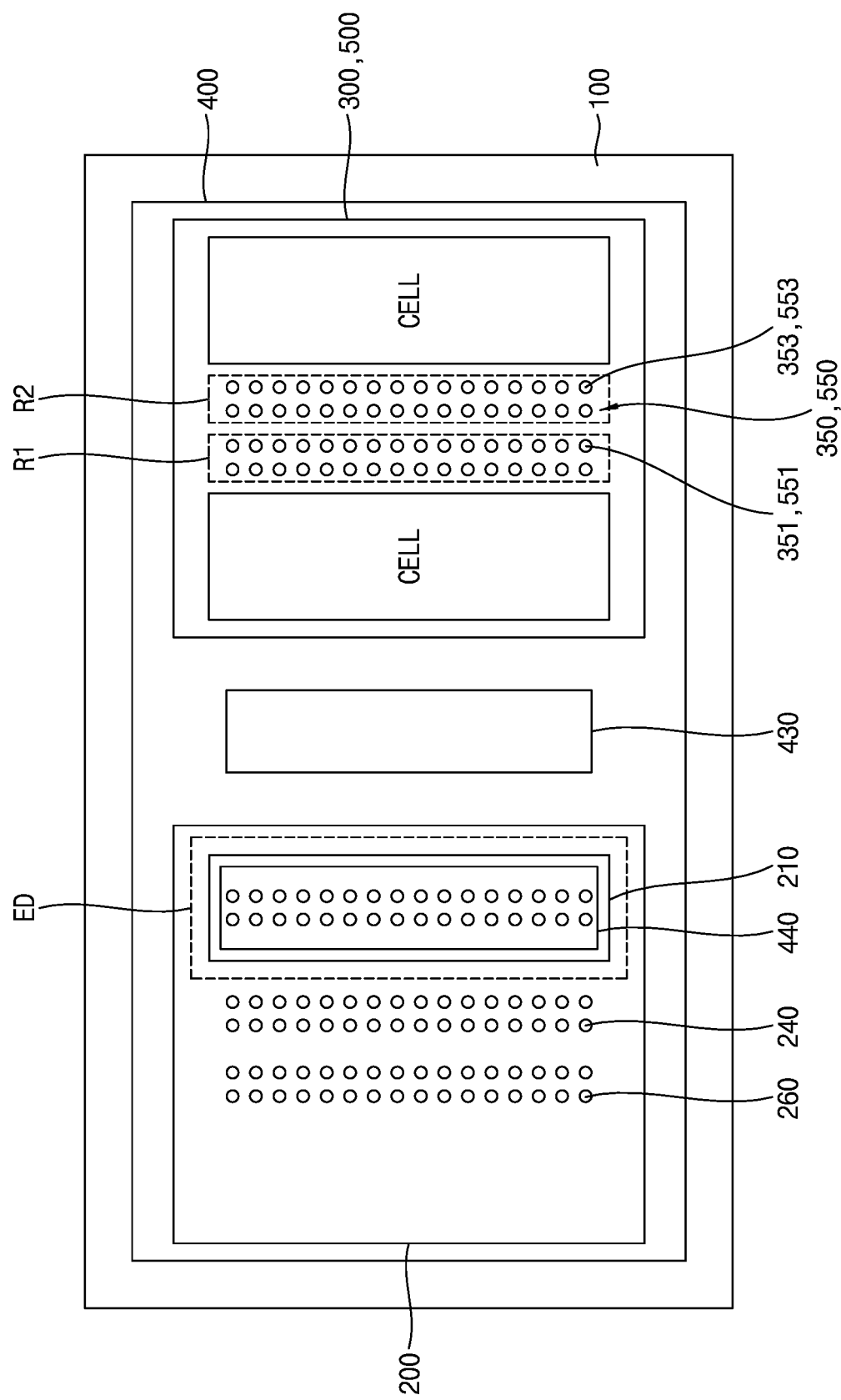

SEMICONDUCTOR PACKAGE INCLUDING INTERPOSER

CROSS-REFERENCE TO RELATED APPLICATION

This application claims priority to Korean Patent Application No. 10-2020-0093027, filed on Jul. 27, 2020, in the Korean Intellectual Property Office, the disclosure of which is herein incorporated by reference in its entirety.

TECHNICAL FIELD

The inventive concept relates to a semiconductor package, and more particularly, to a semiconductor package including an interposer.

DISCUSSION OF THE RELATED ART

As electronic industry advances, electronic devices are progressively miniaturized and are adapted to perform a multitude of tasks, and thus, the speed and capacity of memory applied to electronic devices is increasing.

System in package (SiP) technology has been developed to increase the performance and reduce the cost of electronic devices. According to this technology, semiconductor memory devices are integrated into one package structure along with a processing unit and thus one semiconductor package product performs a high speed operation, massive data processing, and a multifunctional operation. Additionally, high bandwidth memory (HBM) technology has been designed for implementing a large-capacity memory by vertically stacking a plurality of semiconductor chips within a single package. The various stacked memory devices are connected to each other using through silicon via (TSV) technology.

HBMs have a structure where a plurality of vertically stacked semiconductor chips are connected to one another through a TSV and are connected to a processor through a silicon interposer disposed under the semiconductor chips. A semiconductor chip disposed on a lowermost layer among a plurality of vertically stacked semiconductor chips may be a buffer chip and may communicate with a processor to transmit and receive data or to receive various control signals and voltage signals. Semiconductor chips stacked on a buffer chip may be memory chips and may store pieces of data received through the buffer chip. However, as the number of stacked semiconductor chips increases, skew occurs due to a physical distance difference between a memory chip disposed on an uppermost layer and a memory chip disposed on a lowermost layer, causing a problem where electrical characteristic loss occurs, as the uppermost memory chip is more distant from the buffer chip than is the lowermost memory chip.

SUMMARY

A semiconductor package includes a processor, a lower memory including a plurality of lower memory chips that are vertically stacked, an interposer mounted on the processor and the lower memory, and an upper memory mounted on the interposer. The upper memory includes a plurality of upper memory chips that are vertically stacked. The interposer includes a first physical layer (PHY) transmitting and receiving a signal between the processor and the lower memory and transmitting and receiving a signal between the processor and the upper memory. The processor includes a second PHY communicating with the first PHY and a first through silicon via (TSV) electrically connecting the first PHY to the second PHY.

A semiconductor package includes a processor on a substrate, a lower memory including a plurality of lower memory chips vertically stacked on the substrate, an interposer mounted on the processor and the lower memory, and an upper memory mounted on the interposer. The upper memory includes a plurality of upper memory chips that are vertically stacked. The interposer includes a first PHY transmitting and receiving a signal between the processor and the lower memory and transmitting and receiving a signal between the processor and the upper memory. A power TSV passes through the interposer, receives a power signal from the lower memory, and transfers the power signal to the upper memory. A data TSV passes through the interposer, receives a data signal from the lower memory or the upper memory, and transfers the data signal to the first PHY. The processor includes a second PHY communicating with the first PHY and a TSV electrically connecting the first PHY to the second PHY. The first PHY vertically overlaps the second PHY.

A semiconductor package includes a processor disposed on a substrate, a lower memory including a plurality of lower memory chips vertically stacked on the substrate, an interposer mounted on the processor and the lower memory, and a first upper memory mounted on the interposer. The first upper memory includes a plurality of upper memory chips that are vertically stacked. The interposer includes a first PHY electrically connected to the processor, the first upper memory, and the lower memory, a redistribution layer electrically connecting the lower memory to the first PHY and electrically connecting the first upper memory to the first PHY, and a power TSV passing through the interposer, receiving a power signal from the lower memory, and transferring the power signal to the first upper memory. The processor includes a second PHY communicating with the first PHY, a first TSV electrically connecting the first PHY to the second PHY, and a second TSV receiving a power signal from the substrate and transferring the power signal to the power TSV. The first PHY vertically overlaps the second PHY.

A semiconductor package includes a substrate including a first cavity and a second cavity, a processor where at least a portion thereof is disposed in the first cavity, a lower memory including a plurality of lower memory chips that are vertically stacked, at least some of the plurality of lower memory chips being disposed in the second cavity, an interposer disposed on the substrate, the processor, and the lower memory chip, and an upper memory including a plurality of upper memory chips vertically stacked on the interposer.

A semiconductor package includes a base substrate, an interposer disposed above the base substrate, a processor disposed between the interposer and the base substrate, a first memory stack disposed between the interposer and the base substrate and spaced apart from the processor, and a second memory stack disposed above the interposer. The first and second memory stacks communicate with the processor though the interposer.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIG. 3A is a cross-sectional view illustrating a semiconductor package according to an embodiment of the disclosure;

FIG. 3B is a schematic plan view illustrating the semiconductor package illustrated in FIG. 3A;

FIG. 6B is a schematic plan view illustrating the semiconductor package illustrated in FIG. 6A;

FIG. 7B is a schematic plan view illustrating the semiconductor package illustrated in FIG. 7A;

FIG. 9B is a schematic plan view illustrating the semiconductor package illustrated in FIG. 9A;

DETAILED DESCRIPTION OF EXAMPLE EMBODIMENTS

Figure 1A:
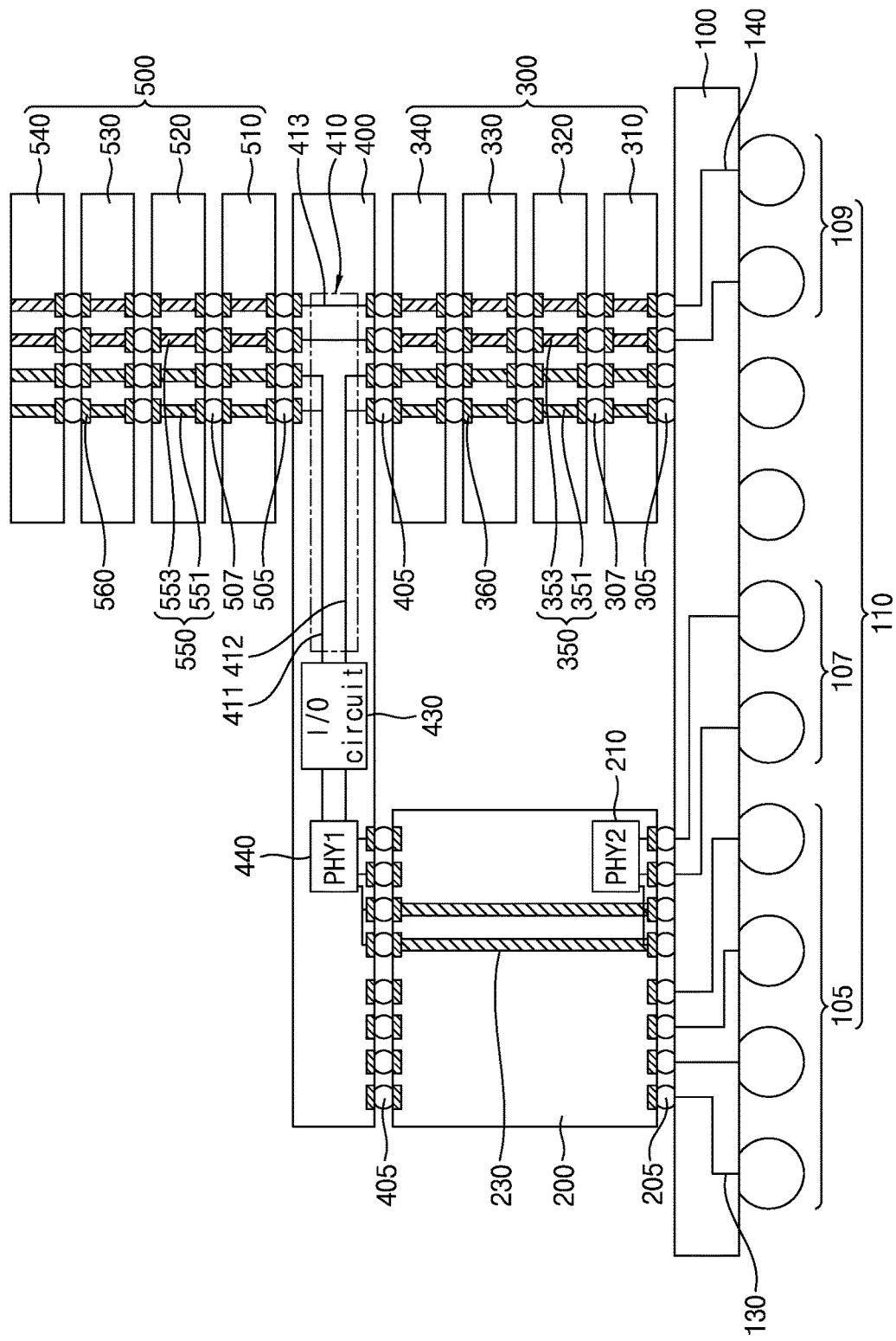
FIG. 1A is a cross-sectional view illustrating a semiconductor package according to an embodiment of the disclosure.
Figure 1B:
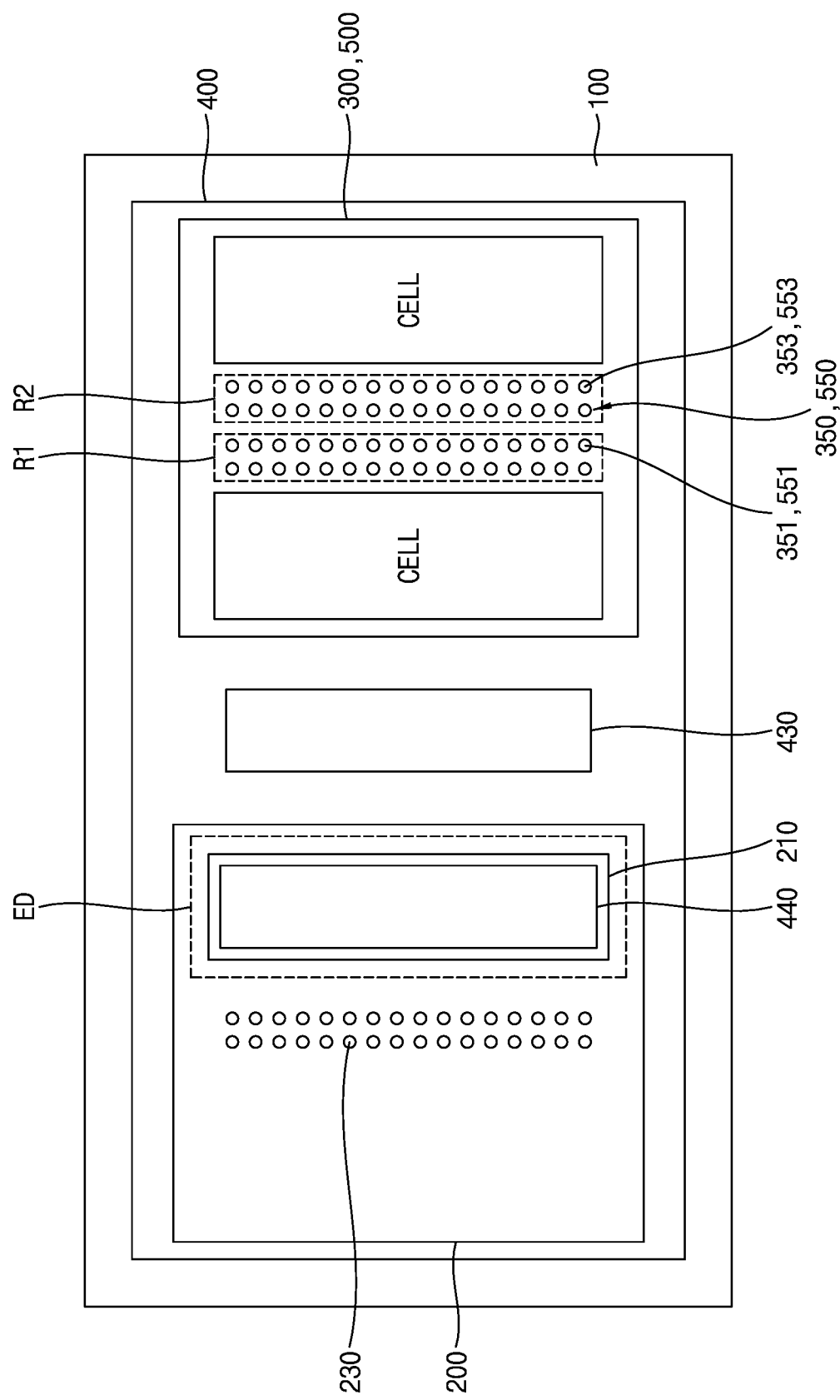
FIG. 1B is a schematic plan view illustrating the semiconductor package illustrated in FIG. 1A.
Figure 1C:
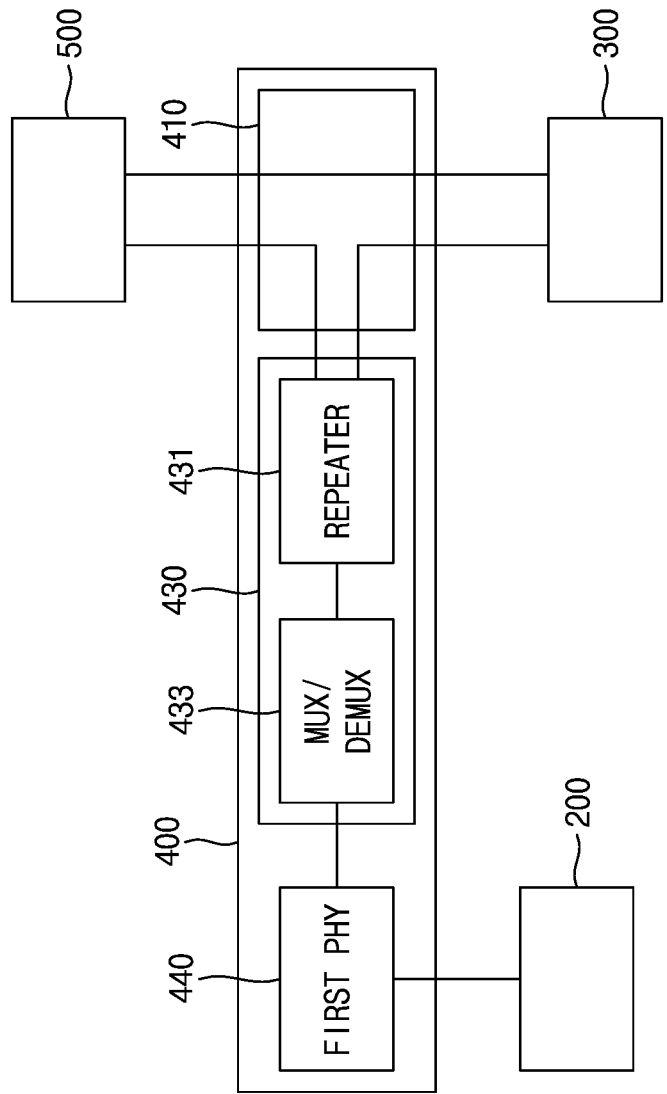
FIG. 1C is a block diagram schematically illustrating an interposer according to an embodiment of the disclosure.

FIG. 1A is a cross-sectional view illustrating a semiconductor package according to an embodiment of the disclosure. FIG. 1B is a schematic plan view illustrating the semiconductor package illustrated in FIG. 1A. FIG. 1C is a block diagram schematically illustrating an interposer according to an embodiment of the disclosure.

Referring to FIGS. 1A and 1B, the semiconductor package may include a processor 200, a lower memory 300, an interposer 400, and an upper memory 500, that are each disposed over a substrate 100.

The substrate 100 may be a printed circuit board (PCB). A connection terminal 110 may be disposed under the substrate 100. The connection terminal 110 may be a solder bump or a solder ball. The connection terminal 110 may include a data terminal 107 that receives a data signal from an external source and a plurality of power terminals 105 and 109 that receive a power signal. A plurality of wiring layers 130 and 140 electrically connected to the connection terminal 110 may be formed in the substrate 100. The plurality of wiring layers 130 and 140 may include a first wiring layer 130 and a second wiring layer 140. The first wiring layer 130 may electrically connect the connection terminal 110 to the processor 200, and the second wiring layer 140 may electrically connect the connection terminal 110 to the lower memory 300. For example, the data signal and a control signal each received by the data terminal 107 may be transmitted to the processor 200 through the first wiring layer 130, and the power signal received by the plurality of power terminals 105 and 109 may be transmitted to the processor 200 through the first wiring layer 130 or may be transmitted to the lower memory 300 through the second wiring layer 140.

The processor 200 may be disposed on and above the substrate 100. The processor 200 may be mounted on the substrate 100 through a plurality of solder bumps 205. For example, the processor 200 may be a host such as a central processing unit (CPU), a graphics processing unit (GPU), or a system on chip (SoC), and for example, may be an application specific integrated circuit (ASIC). The plurality of solder bumps 205 on the substrate 100 may be connected to the first wiring layer 130 formed in the substrate 100, and the processor 200 may be electrically connected to a plurality of connection terminals 110, disposed under the substrate 100, through the plurality of solder bumps 205 and the first wiring layer 130.

The lower memory 300 may be spaced apart from the processor 200, on and above the substrate 100. The lower memory 300 may be mounted on the substrate 100 through the solder bump 305. The lower memory 300 may be a high bandwidth memory (HBM). The lower memory 300 may include a plurality of lower memory chips 310, 320, 330, and 340 that are vertically stacked. Each of the plurality of lower memory chips 310, 320, 330, and 340 may include a memory cell area CELL with a plurality of memory cells integrated therein. For example, each of the plurality of lower memory chips 310, 320, 330, and 340 may be dynamic random access memory (DRAM). The plurality of lower memory chips 310, 320, 330, and 340 may be the same kinds of memory chips. In an embodiment, at least one of the plurality of lower memory chips 310, 320, 330, and 340 may be a different kind of memory chip from the others.

Each of the plurality of lower memory chips 310, 320, 330, and 340 may include a lower TSV 350 and a lower pad 360. The lower TSV 350 may pass through the plurality of lower memory chips 310, 320, 330, and 340. The lower pad 360 may be electrically connected to each of an upper portion and a lower portion of the lower TSV 350. The lower pad 360 may be exposed at surfaces of the plurality of lower memory chips 310, 320, 330, and 340. The solder bump 307 may be disposed between the plurality of lower memory chips 310, 320, 330, and 340. The solder bump 307 may directly contact the lower pad 360. The plurality of lower memory chips 310, 320, 330, and 340 may be electrically connected to the solder bump 307, the lower pad 360, and the lower TSV 350.

The lower memory 300 may include two, four, or eight lower memory chips, but the disclosure is not limited thereto. In an embodiment, the lower memory 300 may include first to fourth lower memory chips 310, 320, 330, and 340 that are sequentially stacked. The first lower memory chip 310 may be disposed at a lowermost portion on the substrate 100, and the fourth lower memory chip 340 may be disposed at an uppermost portion on the substrate 100. It is to be understood that as used herein, "lower" and "below" is a direction measured from the interposer 400 to the substrate 100 and "upper" and "above" is a direction measured from the substrate 100 to the interposer 400 and that the lower memory 300 is lower with respect to the interposer 400 while an upper memory 500 is upper with respect to the interposer 400. A height of a top surface of the fourth lower memory chip 340 disposed at the uppermost portion may be substantially the same as that of a top surface of the processor 200.

The interposer 400 may be disposed on the processor 200 and the lower memory 300. The interposer 400 may include a silicon substrate. One side of the interposer 400 (e.g. a left side) may be mounted on the processor 200 through the solder bump 405. The other side of the interposer 400 (e.g. a right side) may be mounted on the lower memory 300 through the solder bump 405.

The upper memory 500 may be disposed on and above the interposer 400. For example, at least a portion of the interposer 400 may be disposed between the upper memory 500 and the lower memory 300. The upper memory 500 may vertically overlap the lower memory 300. The upper memory 500 might not vertically overlap the processor 200. The upper memory 500 may be an HBM. The upper memory 500 may include a plurality of upper memory chips 510, 520, 530, and 540 that are vertically stacked. Each of the plurality of upper memory chips 510, 520, 530, and 540 may include a memory cell area CELL with a plurality of memory cells integrated therein. For example, each of the plurality of upper memory chips 510, 520, 530, and 540 may be DRAM. The plurality of upper memory chips 510, 520, 530, and 540 may be the same kinds of memory chips. In an embodiment, at least one of the plurality of upper memory chips 510, 520, 530, and 540 may be a different kind of memory chip than the others.

Each of the plurality of upper memory chips 510, 520, 530, and 540 may include an upper TSV 550 and an upper pad 560. The upper TSV 550 may pass through the plurality of upper memory chips 510, 520, 530, and 540. The upper pad 560 may be electrically connected to each of an upper portion and a lower portion of the upper TSV 550. The upper pad 560 may be exposed at surfaces of the plurality of upper memory chips 510, 520, 530, and 540. The solder bump 507 may be disposed between the plurality of upper memory chips 510, 520, 530, and 540. The solder bump 507 may be directly connected to the upper pad 560. The plurality of upper memory chips 510, 520, 530, and 540 may be electrically connected to the solder bump 507, the upper pad 560, and the upper TSV 550.

The upper memory 500 may include two, four, or eight upper memory chips, but the disclosure is not limited thereto. In an embodiment, the upper memory 500 may include first to fourth upper memory chips 510, 520, 530, and 540 that are sequentially stacked. The first upper memory chip 510 may be disposed at a lowermost portion on the interposer 400, and the fourth upper memory chip 540 may be disposed at an uppermost portion on the interposer 400.

The lower TSV 350 included in each of the plurality of lower memory chips 310, 320, 330, and 340 may include a lower data TSV 351 and a lower power TSV 353. The lower data TSV 351 may be electrically connected to the processor 200 through the interposer 400 and may be a path through which a data signal is transmitted. The lower power TSV 353 may be electrically connected to the second redistribution layer 140 of the substrate 100 and may be a path through which a power signal received through the power terminal 109 is transmitted.

For example, some of data signals received through the interposer 400 by the lower data TSV 351 included in the fourth lower memory chip 340 may be transferred to the fourth lower memory chip 340, and the other data signals may be transferred to at least one of the first to third lower memory chips 310 to 330 through the lower data TSV 351. The data signals transferred to the first to fourth lower memory chips 310, 320, 330, and 340 may be stored in the memory cell areas CELL of the first to fourth lower memory chips 310, 320, 330, and 340. The lower power TSV 353 included in the first lower memory chip 310 may transfer some of power signals, received through the substrate 100, to the first lower memory chip 310, and the other power signals may be transferred to at least one of the second to fourth lower memory chips 320 to 340 through the lower power TSV 353.

The plurality of upper memory chips 510, 520, 530, and 540 may each include an upper data TSV 551 and an upper power TSV 553. The upper data TSV 551 may be electrically connected to the processor 200 through the interposer 400 and may be a path through which a data signal is transmitted. The upper power TSV 553 may be electrically connected to the power TSV 353 through the interposer 400 and may be a path through which a power signal received through the lower memory 300 and/or the interposer 400 is transmitted. The upper data TSV 551 may be aligned at a position vertically corresponding to the lower data TSV 351.

The upper power TSV 553 may be aligned at a position vertically corresponding to the lower data TSV 351.

In an embodiment, the interposer 400 may include a routing circuit 410, an input/output (I/O) circuit 430, and a first physical layer (PHY) 440. The routing circuit 410 may be disposed vertically between the upper memory 500 and the lower memory 300 and may be electrically connected to the upper memory 500, the lower memory 300, the I/O circuit 430, and/or the first PHY 440. In an embodiment, the routing circuit 410 may include a plurality of electrically conductive wiring layers 411 to 413 routing signals received from the processor 200, the upper memory 500, and/or the lower memory 300. The plurality of wiring layers 411 to 413 may be electrically connected to the processor 200, the lower memory 300, and the upper memory 500. The plurality of wiring layers 411 to 413 may be disposed in the silicon substrate of the interposer 400.

In an embodiment, the routing circuit 410 may include first to third wiring layers 411 to 413. Each of the first wiring layer 411 and the second wiring layer 412 may be a data line through which a data signal passes. The first wiring layer 411 may electrically connect the upper memory 500 to the I/O circuit 430. The first wiring layer 411 may electrically connect the upper memory 500 to the first PHY 440 through the I/O circuit 430. The first wiring layer 411 may be electrically connected to the upper data TSV 551 of the upper memory 500. The second wiring layer 412 may electrically connect the lower memory 300 to the I/O circuit 430. The second wiring layer 412 may electrically connect the lower memory 300 to the first PHY 440 through the I/O circuit 430. The second wiring layer 412 may be electrically connected to the lower data TSV 351 of the lower memory 300. The first wiring layer 411 and the second wiring layer 412 may be electrically insulated from each other. In an embodiment, the first wiring layer 411 and the second wiring layer 412 may be electrically connected to each other.

The third wiring layer 413 may be a power line through which a power signal passes. The third wiring layer 413 may electrically connect the lower power TSV 353 of the lower memory 300 and the upper power TSV 553 of the upper memory 500. Therefore, a power signal received through the substrate 100 may be transmitted to the upper power TSV 553 through the lower power TSV 353 and the third wiring layer 413 of the interposer 400. The third wiring layer 413 may be electrically connected to the first and second wiring layers 411 and 412.

Referring to FIGS. 1A to 1C, the I/O circuit 430 may be disposed between the routing circuit 410 and the first PHY 440 to electrically connect the routing circuit 410 to the first PHY 440. In an embodiment, the I/O circuit 430 may include a repeater 431 and/or a multiplexer/demultiplexer 433. The repeater 431 may compensate for the signal integrity of signals received through the routing circuit 410 and/or the signal integrity of signals received through the first PHY 440. The repeater 431 may be disposed between the routing circuit 410 and the multiplexer/demultiplexer 433 and/or between the first PHY 440 and the multiplexer/demultiplexer 433. The I/O circuit 430 may include a plurality of repeaters 431. The multiplexer/demultiplexer 433 may multiplex signals received from the routing circuit 410 or signals received through the repeater 431 and may transmit the multiplexed signals to the first PHY 440. Also, the multiplexer/demultiplexer 433 may demultiplex signals received from the first PHY 440 and may transmit the demultiplexed signals to the repeater 431 or the routing circuit 410.

Referring to FIGS. 1A and 1B, the first PHY 440 may be disposed on the processor 200. The first PHY 440 may be a physical layer that enables each of the upper memory 500 and the lower memory 300 to communicate with the processor 200. The first PHY 440 may transmit signals, received through the I/O circuit 430 and/or the routing circuit 410, to the processor 200 and may transmit signals, received from the processor 200, to the upper memory 500 and/or the lower memory 300 through the I/O circuit 430 or the routing circuit 410.

The first PHY 440 may vertically overlap the processor 200. In an embodiment, the first PHY 440 may be disposed in an edge region ED of the processor 200 to vertically overlap the processor 200. The first PHY 440 may be disposed in an edge region ED, disposed close to the lower memory 300 and the upper memory 500, of a plurality of edge regions of the processor 200.

The processor 200 may include a second PHY 210 and a TSV 230. The second PHY 210 may be a physical layer that is electrically connected to the first PHY 440 to enable the processor 200 to communicate with the lower memory 300 and/or the upper memory 500. Also, the second PHY 210 may be a physical layer that enables the processor 200 to communicate with external devices connected to the processor 200 through the substrate 100. The second PHY 210 may be disposed under the processor 200 and may be electrically connected to the substrate 100 through the solder bump 205. For example, the second PHY 210 may be connected to the data terminal 107 through the first wiring layer 130. The second PHY 210 may be disposed in the edge region ED under the processor 200. The second PHY 210 may be disposed in an edge region ED, disposed close to the lower memory 300 and the upper memory 500, of the plurality of edge regions of the processor 200. Accordingly, the second PHY 210 may vertically overlap the first PHY 440 of the interposer 400.

The TSV 230 may vertically pass through the processor 200 and may be disposed adjacent to the second PHY 210 in the processor 200. For example, in a plan view, the TSV 230 may be disposed adjacent to the edge region ED. The first PHY 440 and the TSV 230 may be electrically connected to each other and may have a fan-out configuration, and moreover, the second PHY 210 and the TSV 230 may be electrically connected to each other and may have a fan-out configuration. Therefore, a data signal input through the first wiring layer 130 and the data terminal 107 of the substrate 100 or a data signal generated from the processor 200 may be transmitted to the first PHY 440 of the interposer 400 through the second PHY 210 and the TSV 230 and may be provided to the upper memory 500 and the lower memory 300 through the I/O circuit 430 and/or the routing circuit 410 of the interposer 400. Also, a data signal read from each of the upper memory 500 and the lower memory 300 may be transmitted to the processor 200 through the routing circuit 410, the I/O circuit 430, and the first PHY 440, and the processor 200 may receive the data signal read through the second PHY 210 and the TSV 230 of the processor 200. The first PHY 440 and the second PHY 210 may be connected to the TSV 230 with vertically overlapping each other and the TSV 230 may be disposed adjacent to the first PHY 440 and the second PHY 210, and thus, a signal transfer distance between the first PHY 440 and the second PHY 210 may be reduced, thereby minimizing channel loss.

Referring to FIG. 1B, the upper TSV 550 and the lower TSV 350 may be disposed between a plurality of memory cell areas CELL. In an embodiment, in a plan view, the upper data TSV 551 and the lower data TSV 351 may be disposed in a first region R1 relatively close to the processor 200, and the upper power TSV 553 and the lower power TSV 353 may be disposed in a second region R2 relatively far away from the processor 200. However, the disclosure is not limited thereto, and the upper data TSV 551 and the upper power TSV 553 may be disposed between the plurality of memory cell areas CELL, and the upper power data TSV 553 and the lower power TSV 353 may be disposed between the plurality of memory cell areas CELL. In FIGS. 1A and 1B, the upper and lower data TSVs 351 and 551 and the upper and lower power TSVs 353 and 553 are illustrated to have the same diameter, but are not limited thereto and may have different diameters.

Figure 1D:
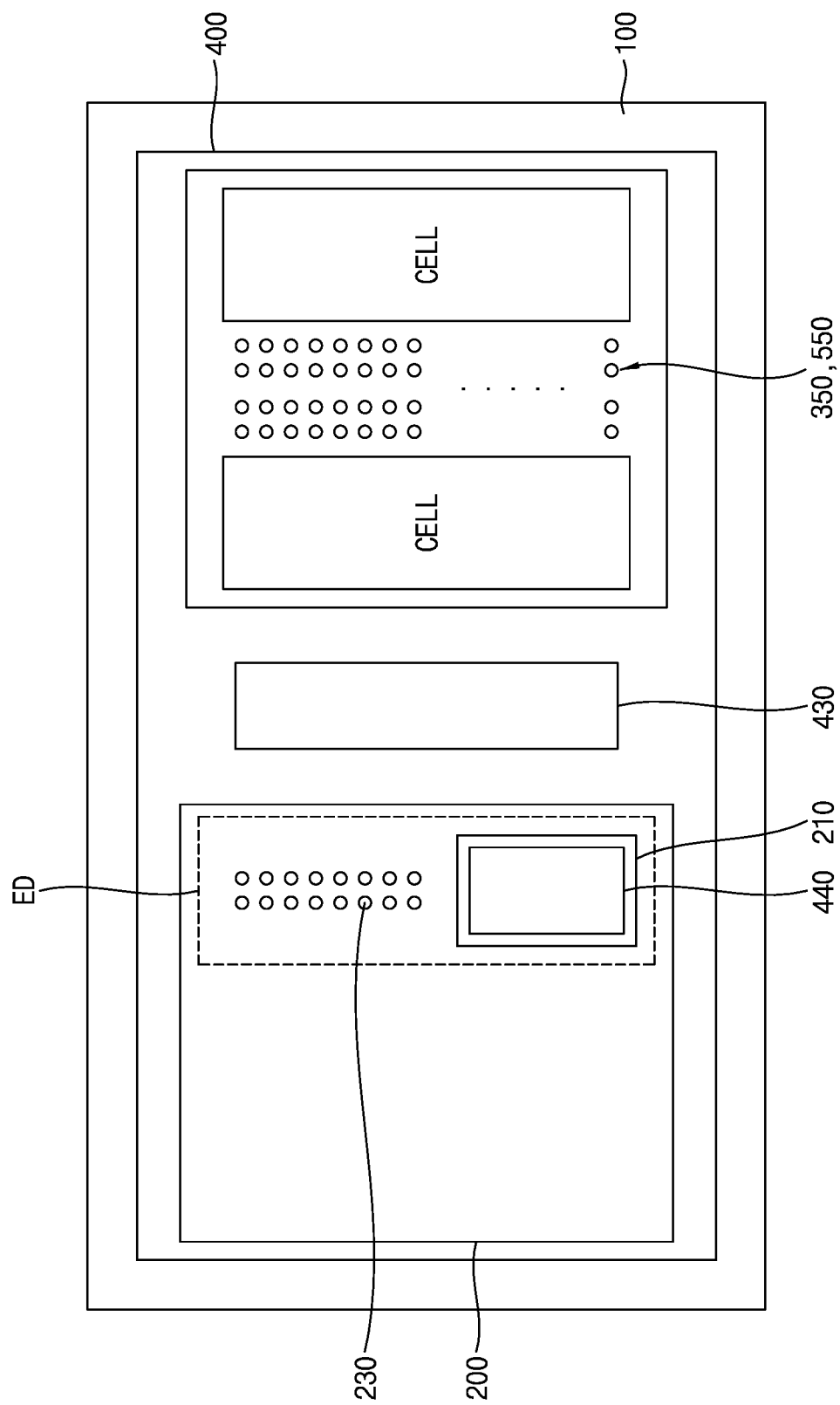
FIG. 1D is a plan view illustrating a semiconductor package according to an embodiment of the disclosure.

FIG. 1D is a plan view of a semiconductor package according to an embodiment of the disclosure.

Referring to FIG. 1D, the second PHY 210 and the TSV 230 of the processor 200 may each be disposed in the edge region ED. The second PHY 210 of the processor 200 may be disposed at one side of the edge region ED, and the TSV 230 may be disposed at one side of the second PHY 210 in the edge region ED. The first PHY 440 of the interposer 400 may vertically overlap the second PHY 210. In an embodiment, the first PHY 440 may vertically overlap the TSV 230 without overlapping the second PHY 210.

Figure 2A:
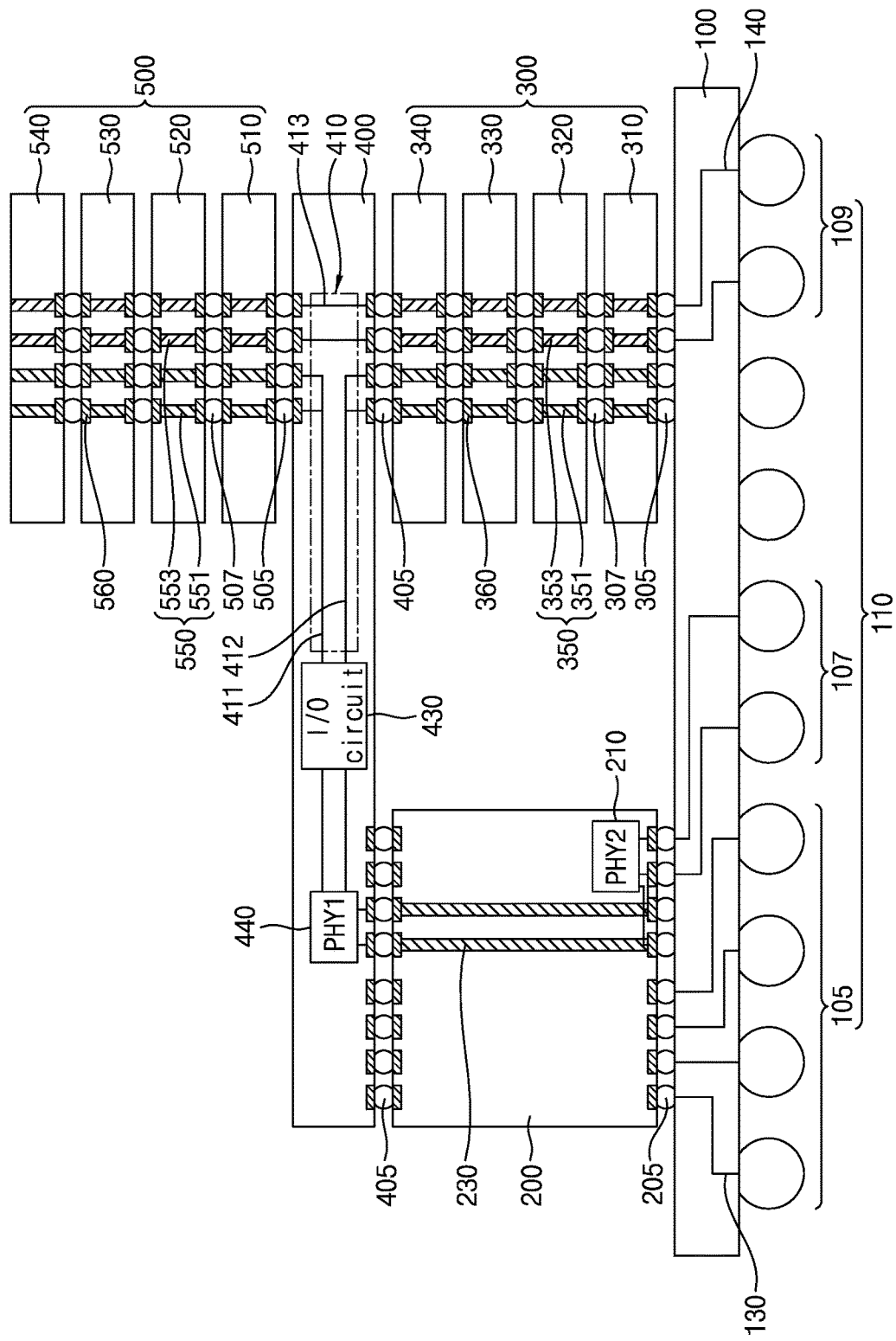
FIG. 2A is a cross-sectional view illustrating a semiconductor package according to an embodiment of the disclosure.
Figure 2B:
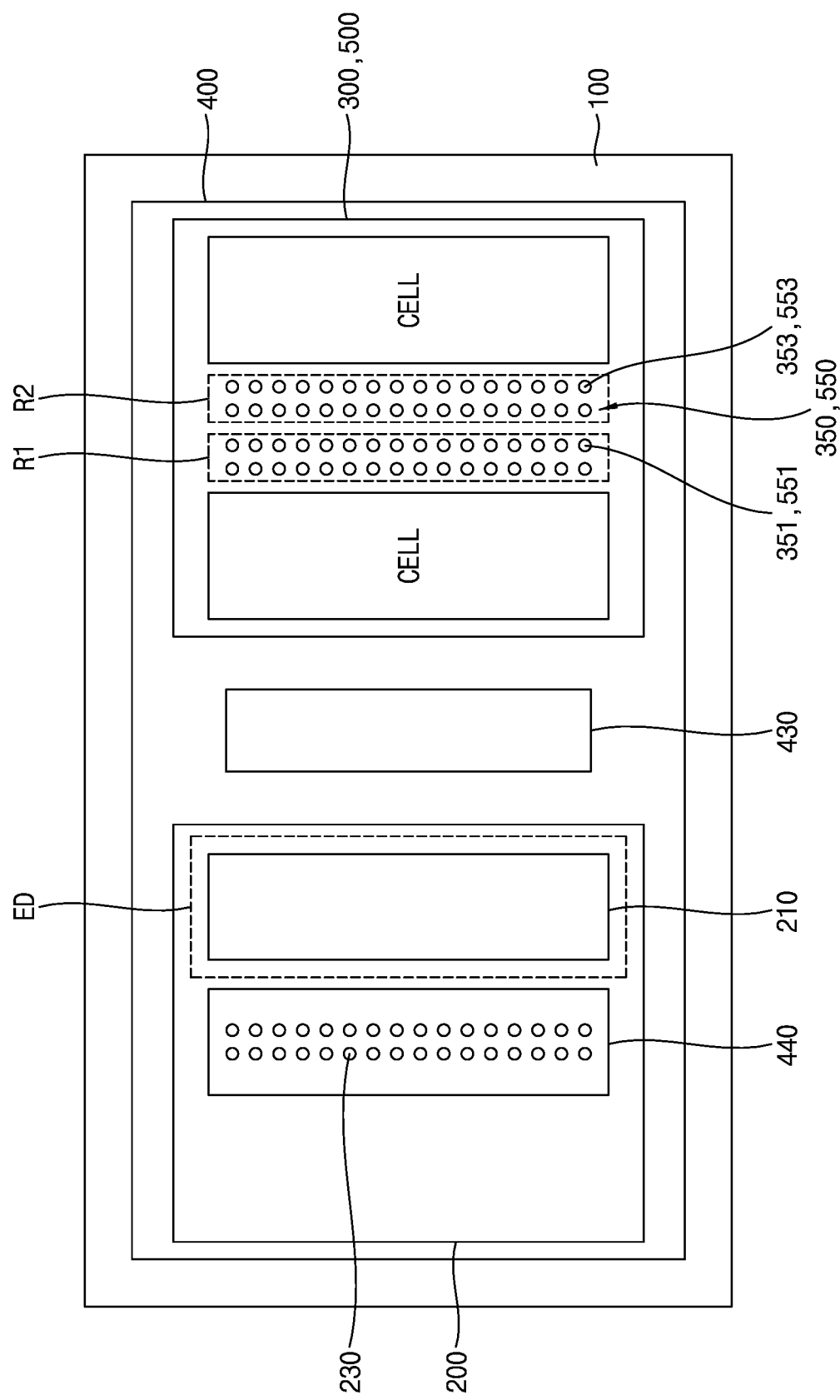
FIG. 2B is a schematic plan view illustrating the semiconductor package illustrated in FIG. 2A.

FIG. 2A is a cross-sectional view illustrating a semiconductor package according to an embodiment of the disclosure. FIG. 2B is a schematic plan view illustrating the semiconductor package illustrated in FIG. 2A.

Referring to FIGS. 2A and 2B, a first PHY 440 of an interposer 400 and a second PHY 210 of a processor 200 might not vertically overlap each other. The second PHY 210 of the processor 200 may be disposed in an edge region ED, and a TSV 230 of the processor 200 may be disposed adjacent to the second PHY 210, outside the edge region ED. The first PHY 440 of the interposer 400 may vertically overlap the TSV 230 of the processor 200. Accordingly, the first PHY 440 may be connected to the TSV 230 and may have a fan-in configuration, and the second PHY 210 may be connected to the TSV 230 and may have a fan-out configuration.

FIG. 3A is a cross-sectional view illustrating a semiconductor package according to an embodiment of the disclosure. FIG. 3B is a schematic plan view illustrating the semiconductor package illustrated in FIG. 3A.

Referring to FIGS. 3A and 3B, a second PHY 210 of a processor 200 may be disposed in an edge region ED of the processor 200. In a plan view, a first PHY 440 of an interposer 400 may be spaced apart from the edge region ED and may be disposed outside the edge region ED. In a plan view, a TSV 230 of the processor 200 may be disposed between the first PHY 440 and the second PHY 210. Accordingly, the first PHY 440 and the second PHY 210 may each be connected to the TSV 230 and may have a fan-out configuration.

Figure 4A:
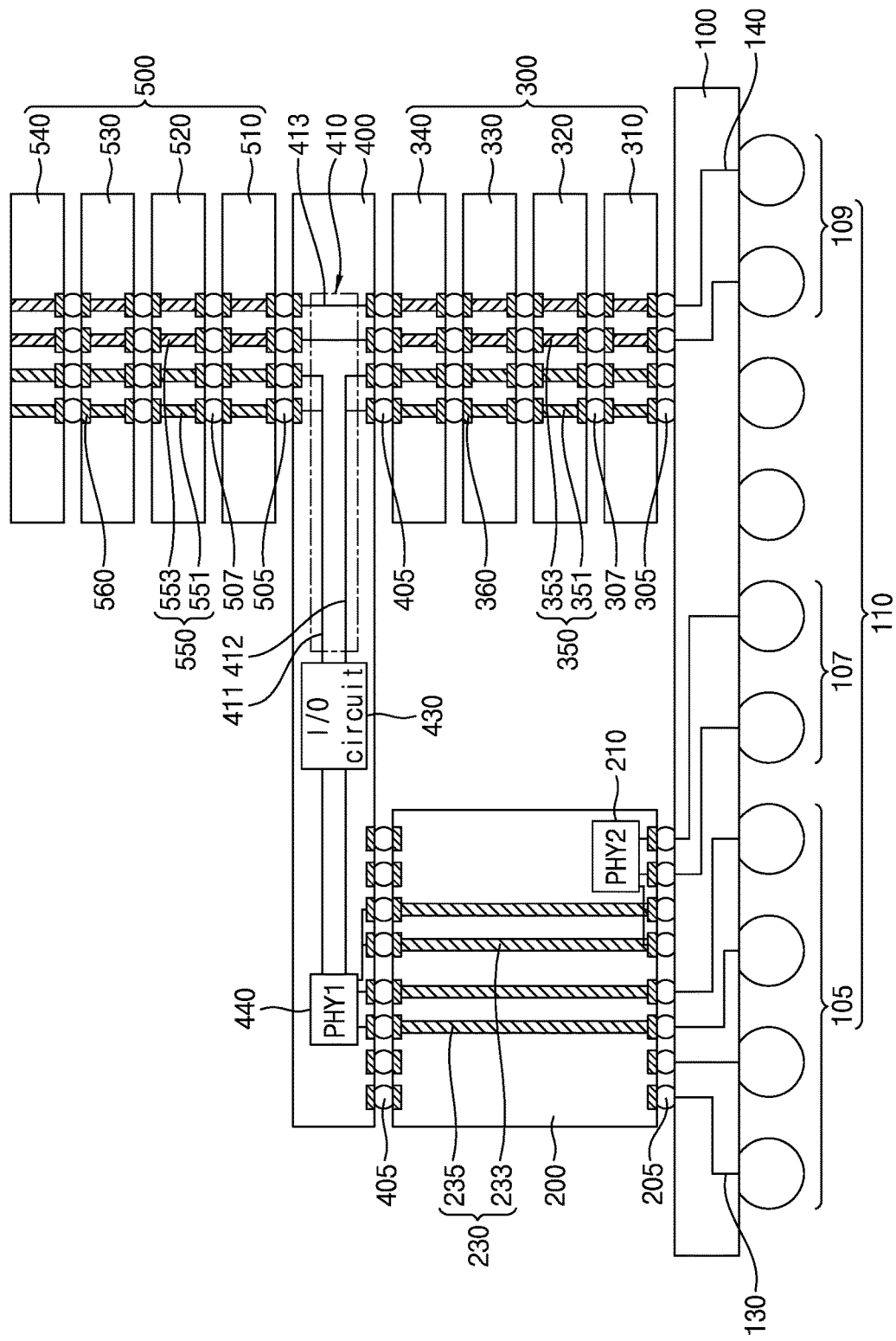
FIG. 4A is a cross-sectional view illustrating a semiconductor package according to an embodiment of the disclosure.
Figure 4B:
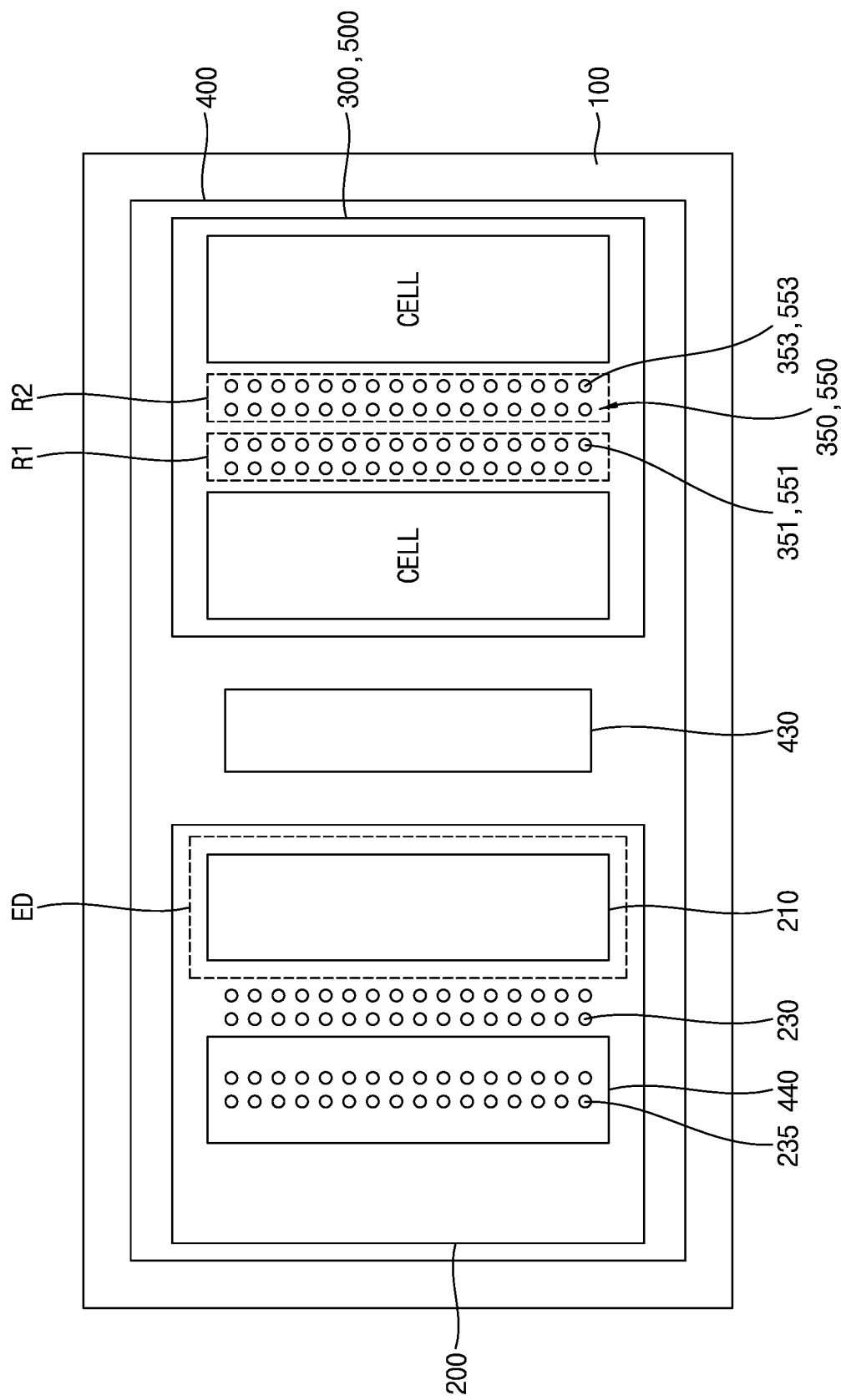
FIG. 4B is a schematic plan view illustrating the semiconductor package illustrated in FIG. 4A.

FIG. 4A is a cross-sectional view illustrating a semiconductor package according to an embodiment of the disclosure. FIG. 4B is a schematic plan view illustrating the semiconductor package illustrated in FIG. 4A.

Referring to FIGS. 4A and 4B, in an embodiment, in a plan view, a TSV 230 of a processor 200 may include a first TSV 233 disposed between a first PHY 440 and a second PHY 210 and a second TSV 235 disposed under the first PHY 440. For example, the second TSV 235 may vertically overlap the first PHY 440. The first TSV 233 and the second TSV 235 may each be electrically connected to the first PHY 440. The first TSV 233 may be connected to the first PHY 440 and may have a fan-out configuration, and the second TSV 235 may be connected to the first PHY 440 and may have a fan-in configuration. The first TSV 233 and the second TSV 235 may be connected to the second PHY 210 and may have a fan-out configuration. In an embodiment, the second TSV 235 may be insulated from the second PHY 210.

Figure 5A:
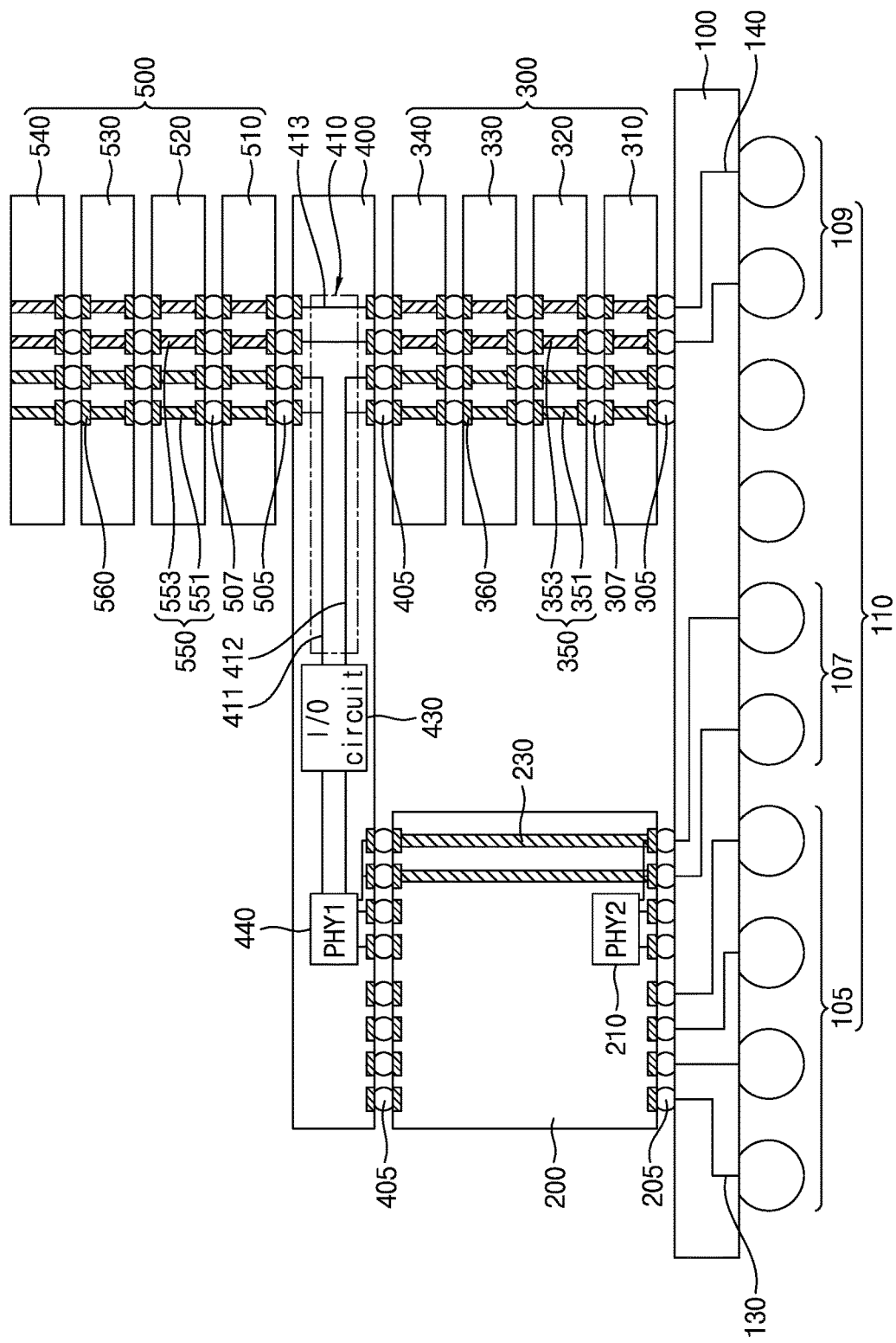
FIG. 5A is a cross-sectional view illustrating a semiconductor package according to an embodiment of the disclosure.
Figure 5B:
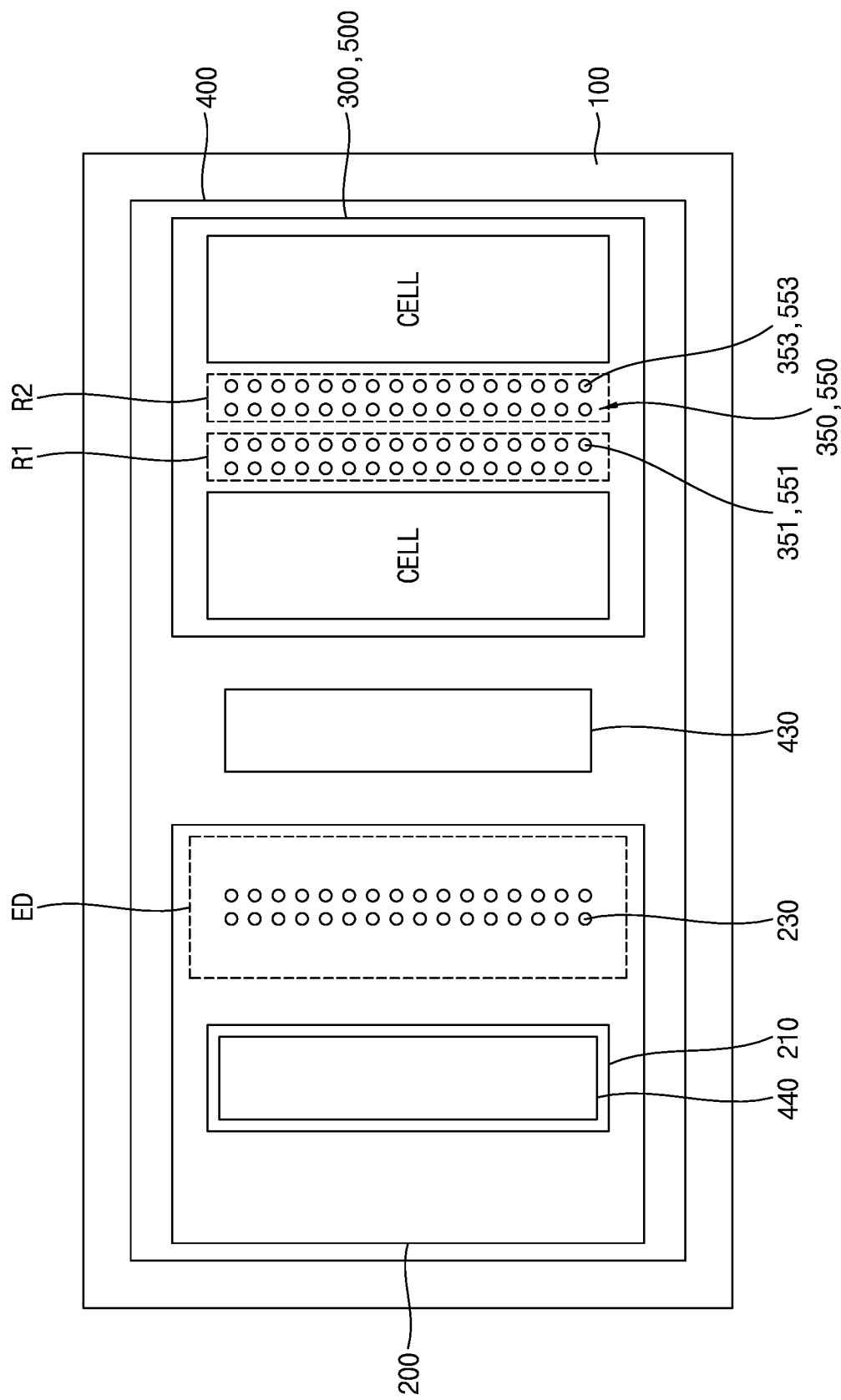
FIG. 5B is a schematic plan view illustrating the semiconductor package illustrated in FIG. 5A.

FIG. 5A is a cross-sectional view illustrating a semiconductor package according to an embodiment of the disclosure. FIG. 5B is a schematic plan view illustrating the semiconductor package illustrated in FIG. 5A.

Referring to FIGS. 5A and 5B, a TSV 230 of a processor 200 may be disposed in an edge region ED of a processor 200, and a second PHY 210 of the processor 200 may be disposed adjacent to the TSV 230, outside the edge region ED. A first PHY 440 of an interposer 400 may be disposed at a position that vertically overlaps the second PHY 210. Each of the first PHY 440 and the second PHY 210 may be connected to the TSV 230 and may have a fan-out configuration.

Figure 6A:
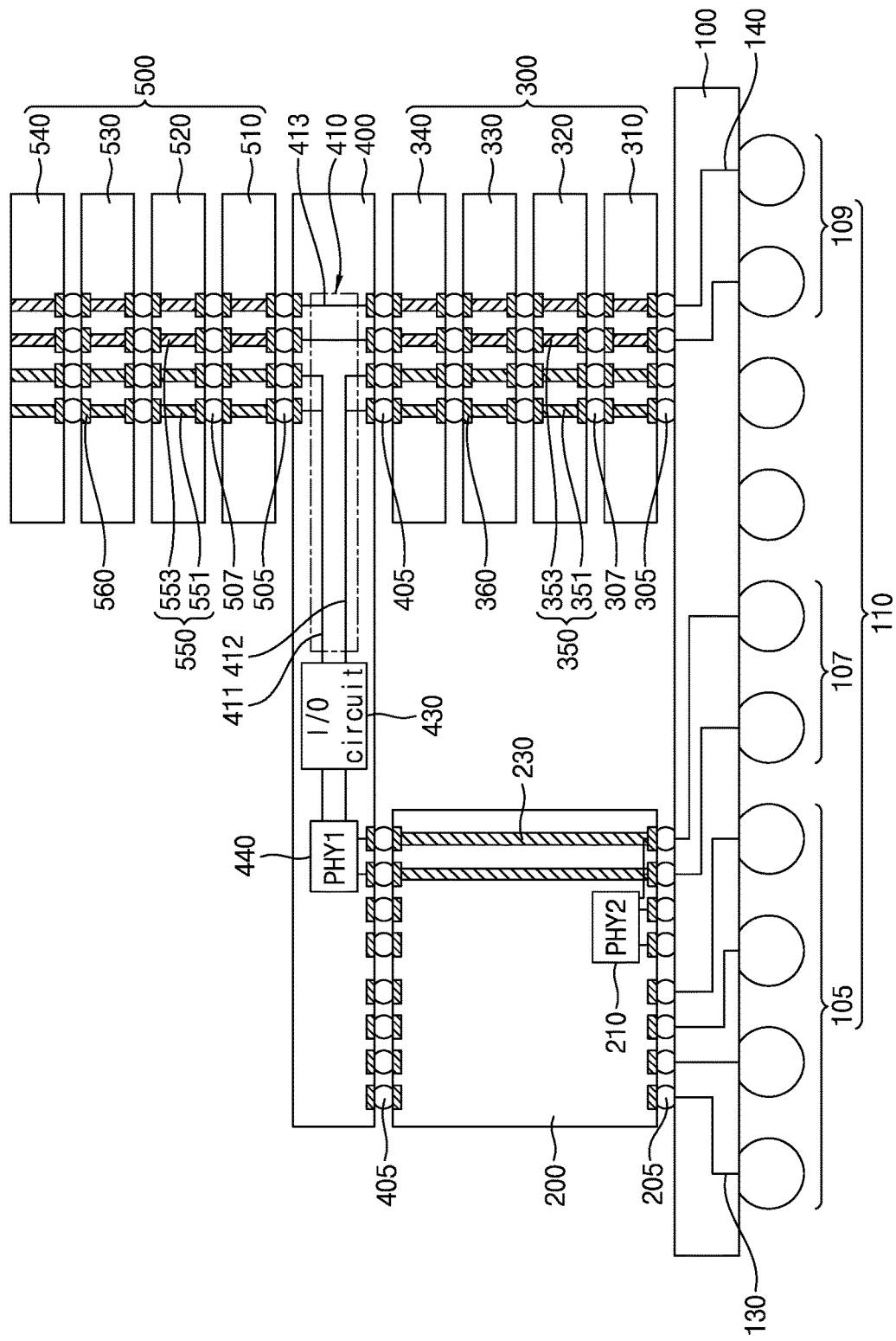
FIG. 6A is a cross-sectional view illustrating a semiconductor package according to an embodiment of the disclosure.

FIG. 6A is a cross-sectional view illustrating a semiconductor package according to an embodiment of the disclosure. FIG. 6B is a schematic plan view illustrating the semiconductor package illustrated in FIG. 6A.

Referring to FIGS. 6A and 6B, a TSV 230 of a processor 200 may be disposed in an edge region ED of the processor 200, and a first PHY 440 of an interposer 400 may be disposed in the edge region ED of the processor 200. The TSV 230 of the processor 200 may vertically overlap the first PHY 440. A second PHY 210 of the processor 200 may be disposed adjacent to the TSV 230, outside the edge region ED. The first PHY 440 may be connected to the TSV 230 and may have a fan-in configuration, and the second PHY 210 may be connected to the TSV 230 and may have a fan-out configuration.

Figure 7A:
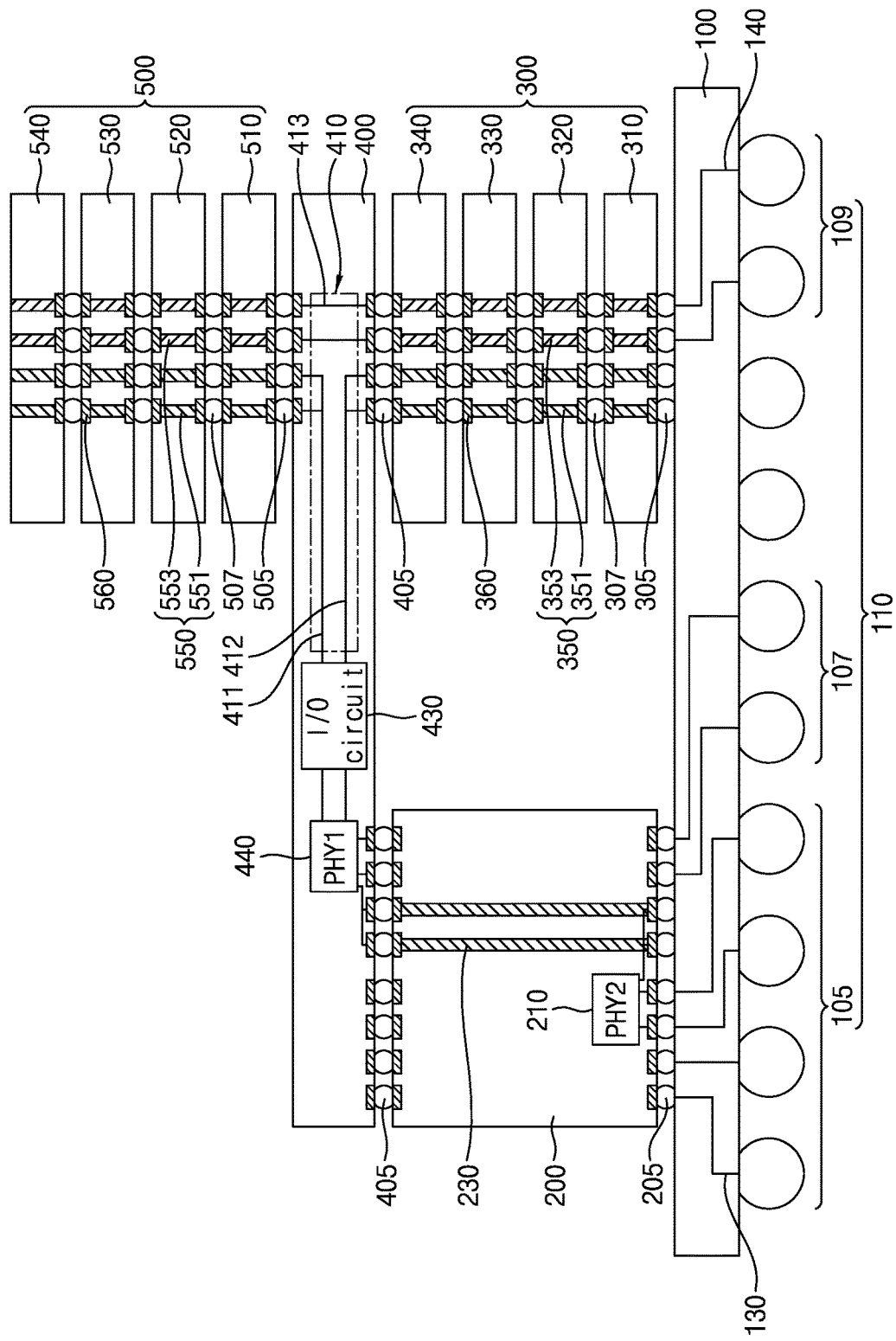
FIG. 7A is a cross-sectional view illustrating a semiconductor package according to an embodiment of the disclosure.

FIG. 7A is a cross-sectional view illustrating a semiconductor package according to an embodiment of the disclosure. FIG. 7B is a schematic plan view illustrating the semiconductor package illustrated in FIG. 7A.

Referring to FIGS. 7A and 7B, a first PHY 440 of an interposer 400 may be disposed in an edge region ED of a processor 200. A second PHY 210 of the processor 200 may be spaced apart from the edge region ED and may be disposed outside the edge region ED. In a plan view, a TSV 230 of the processor 200 may be disposed between the first PHY 440 and the second PHY 210. Each of the first PHY 440 and the second PHY 210 may be connected to the TSV 230 and may have a fan-out configuration.

Figure 8A:
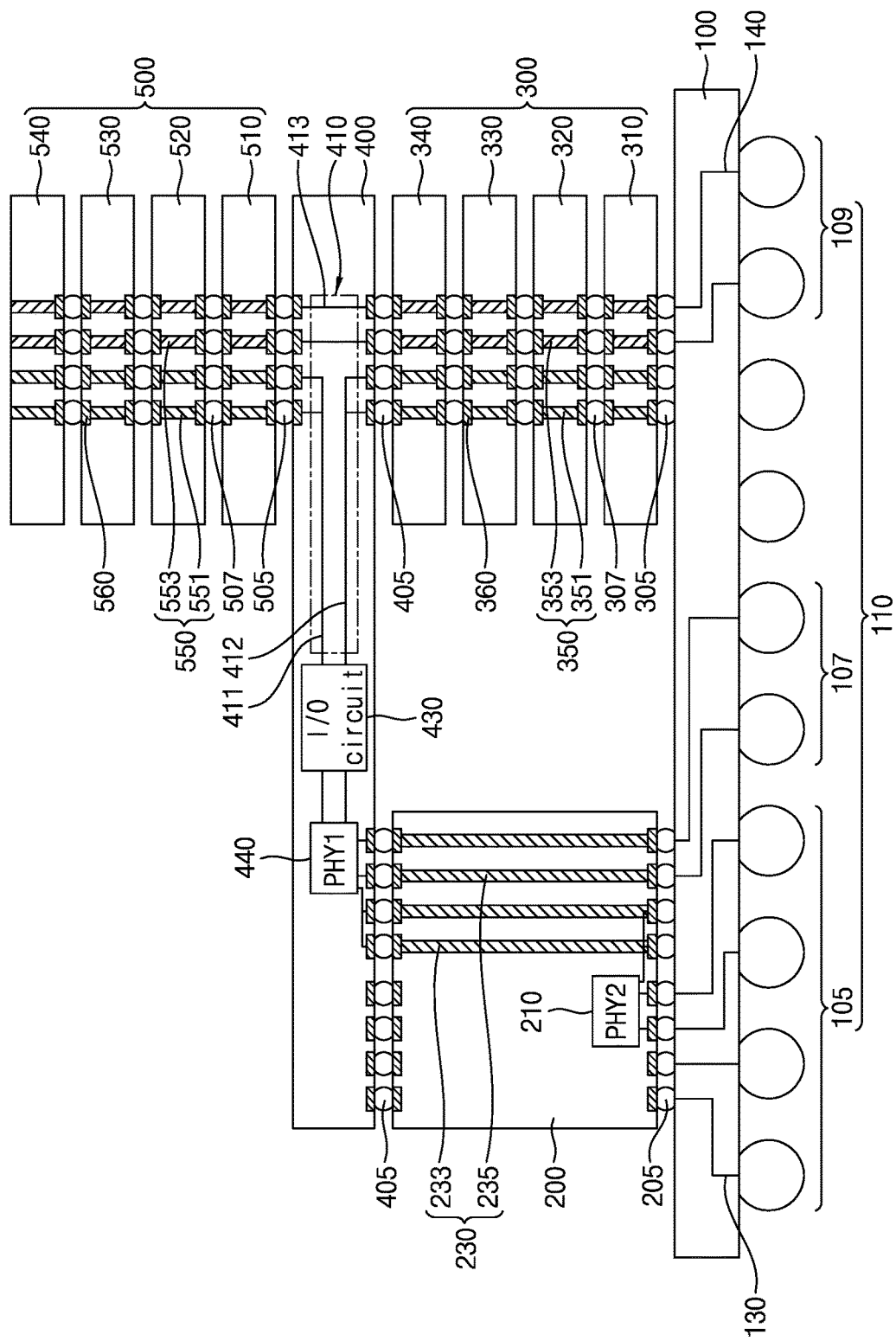
FIG. 8A is a cross-sectional view illustrating a semiconductor package according to an embodiment of the disclosure.
Figure 8B:
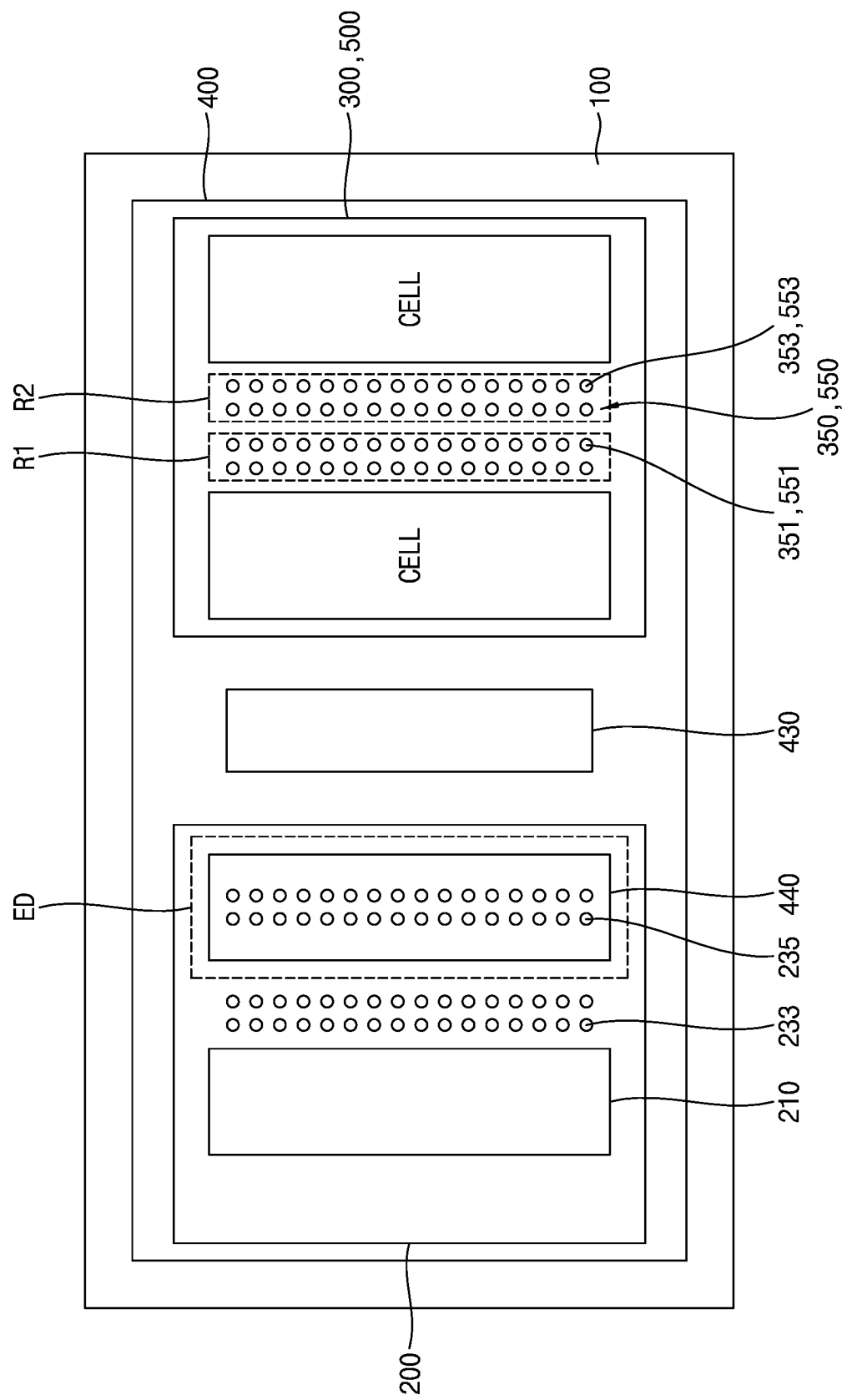
FIG. 8B is a schematic plan view illustrating the semiconductor package illustrated in FIG. 8A.

FIG. 8A is a cross-sectional view illustrating a semiconductor package according to an embodiment of the disclosure. FIG. 8B is a schematic plan view illustrating the semiconductor package illustrated in FIG. 8A.

Referring to FIGS. 8A and 8B, in a plan view, a TSV 230 may include a first TSV 233 disposed between a first PHY 440 and a second PHY 210 and a second TSV 235 disposed under the first PHY 440. For example, the second TSV 235 may vertically overlap the first PHY 440. The first TSV 233 and the second TSV 235 may each be electrically connected to the first PHY 440. The first TSV 233 may be connected to the first PHY 440 and may have a fan-out configuration, and the second TSV 235 may be connected to the first PHY 440 and may have a fan-in configuration. Also, the first TSV 233 and the second TSV 235 may be connected to the second PHY 210 and may have a fan-out configuration. In an embodiment, the second TSV 235 may be insulated from the second PHY 210.

Figure 9A:
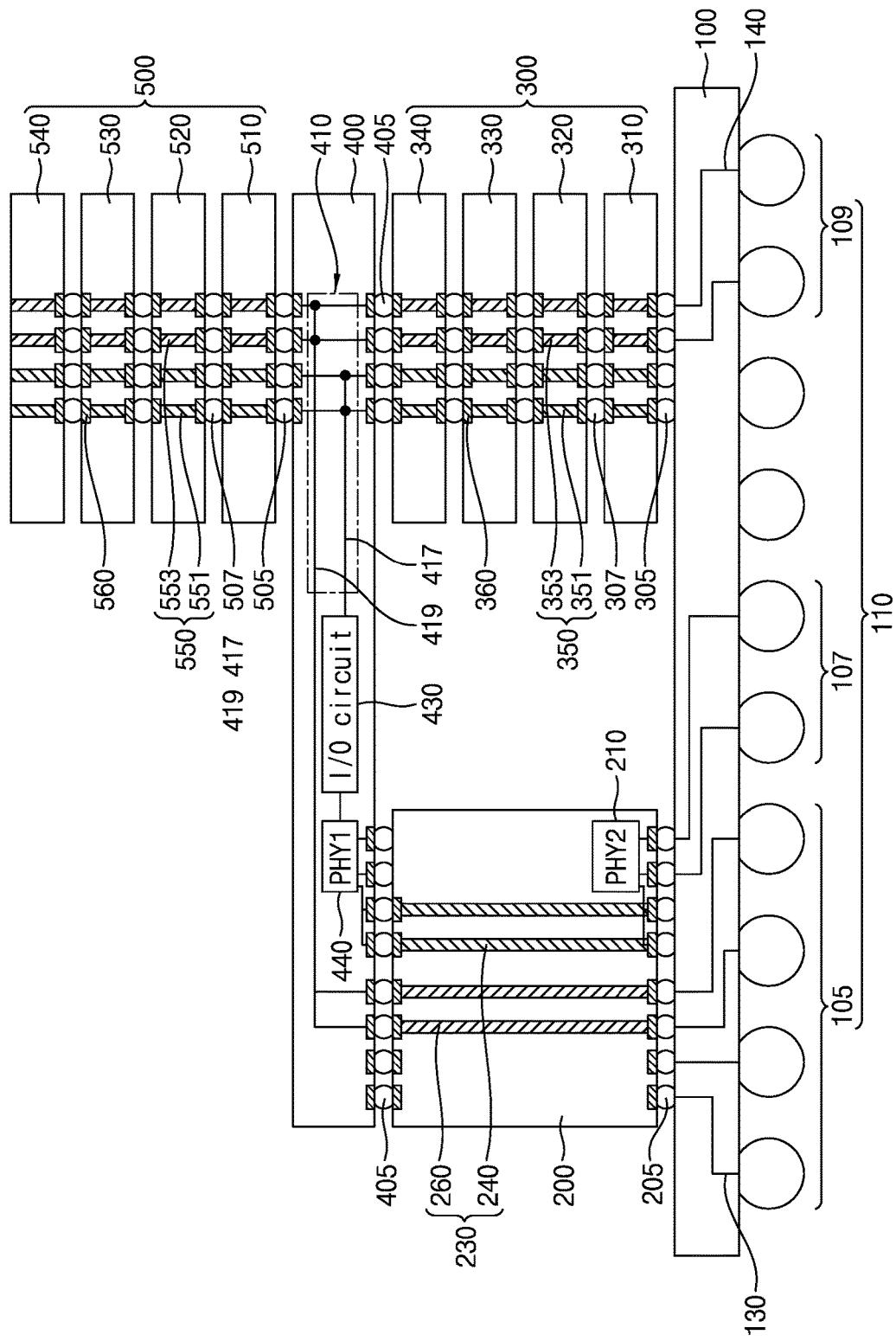
FIG. 9A is a cross-sectional view illustrating a semiconductor package according to an embodiment of the disclosure.

FIG. 9A is a cross-sectional view illustrating a semiconductor package according to an embodiment of the disclosure. FIG. 9B is a schematic plan view illustrating the semiconductor package illustrated in FIG. 9A.

Referring to FIGS. 9A and 9B, a TSV 230 may include a data TSV 240 and a power TSV 260. The data TSV 240 may be a TSV that electrically connects a first PHY 440 to a second PHY 210. The data TSV 240 may have the same configuration and may perform the same function as those of the TSV 230 described above with reference to FIGS. 2A to 8A, and thus, to the extent that a detailed description of various elements has been omitted, it may be assumed that the omitted description is at least similar to corresponding elements that have been described elsewhere within the instant disclosure.

The power TSV 260 may be spaced apart from the edge region ED and may be disposed outside the edge region ED. The power TSV 260 may be disposed at one side of each of the data TSV 240, the first PHY 440, and the second PHY 210, and in a plan view, may be disposed relatively farther away from an upper memory 500 and a lower memory 300 than the data TSV 240, the first PHY 440, and the second PHY 210. The power TSV 260 may transfer a power signal, received through a power terminal 105 of a substrate 100, to an interposer 400. The power TSV 260 may be insulated from the data TSV 240, the first PHY 440, and the second PHY 210. In an embodiment, the power TSV 260 may be insulated from an I/O circuit 430. The power TSV 260 may be connected to a routing circuit 410 of the interposer 400, and for example, may be electrically connected to an upper power TSV 553 of the upper memory 500 and a lower power TSV 353 of the lower memory 300 through a wiring layer 419 of the routing circuit 410.

Figure 10:
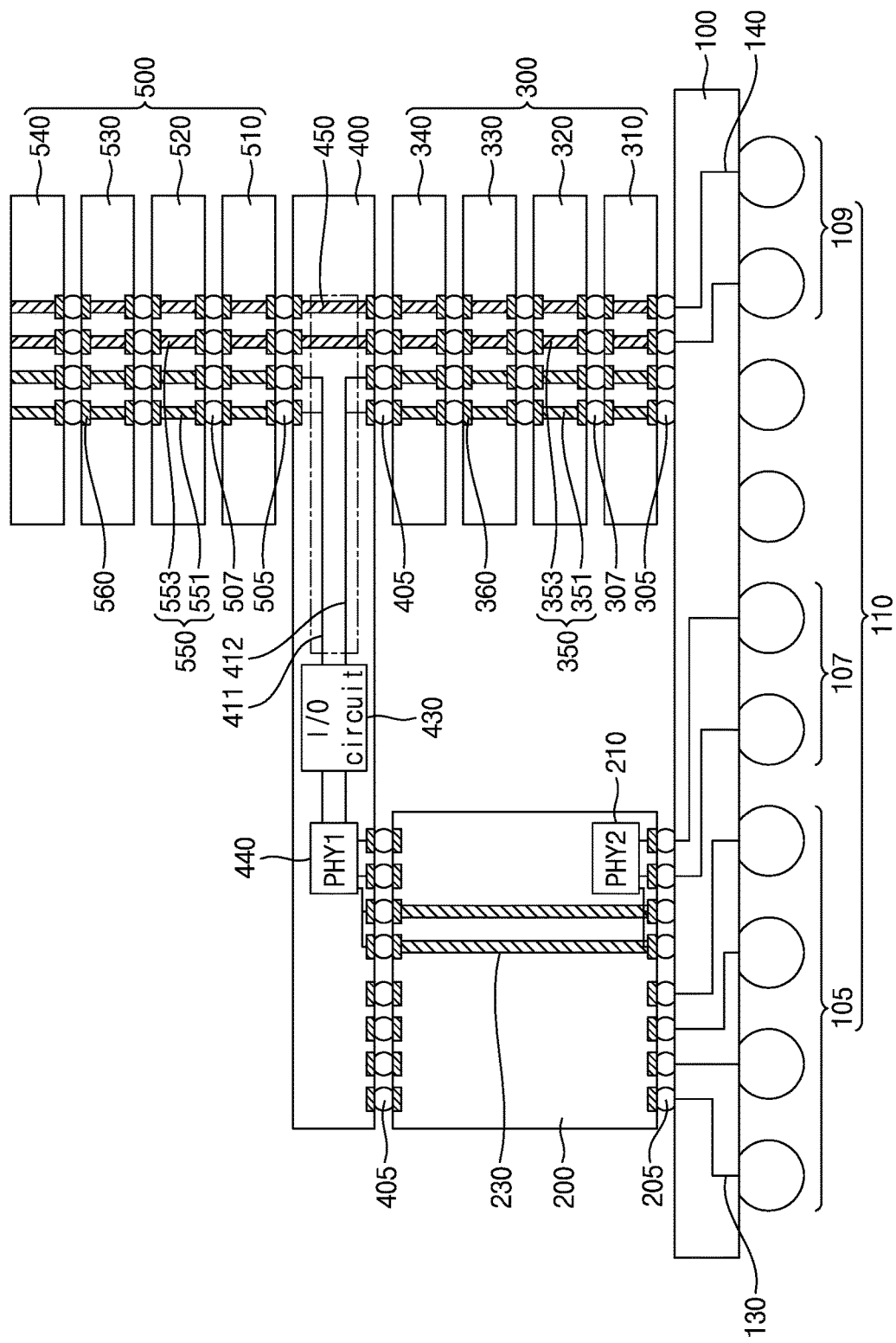
FIG. 10 is a cross-sectional view illustrating a semiconductor package according to an embodiment of the disclosure.

FIG. 10 is a cross-sectional view illustrating a semiconductor package according to an embodiment of the disclosure.

Referring to FIG. 10, in an embodiment, an interposer 400 may include a power TSV 450. The power TSV 450 may be aligned at a position that vertically corresponds to an upper power TSV 553 of an upper memory 500 and a lower power TSV 353 of a lower memory 300. The power TSV 450 may electrically connect the upper memory 500 to the lower memory 300. For example, the power TSV 450 may electrically connect the upper power TSV 553 to the lower power TSV 353. Accordingly, a power signal received through a substrate 100 may pass through the lower power TSV 353 of the lower memory 300, may pass through the power TSV 450 of the interposer 400, and may be transmitted to a plurality of upper memory chips 510, 520, 530, and 540 through the upper power TSV 553 of the upper memory 500. The power TSV 450 may be electrically insulated from a plurality of wiring layers 411 and 412.

Figure 11:
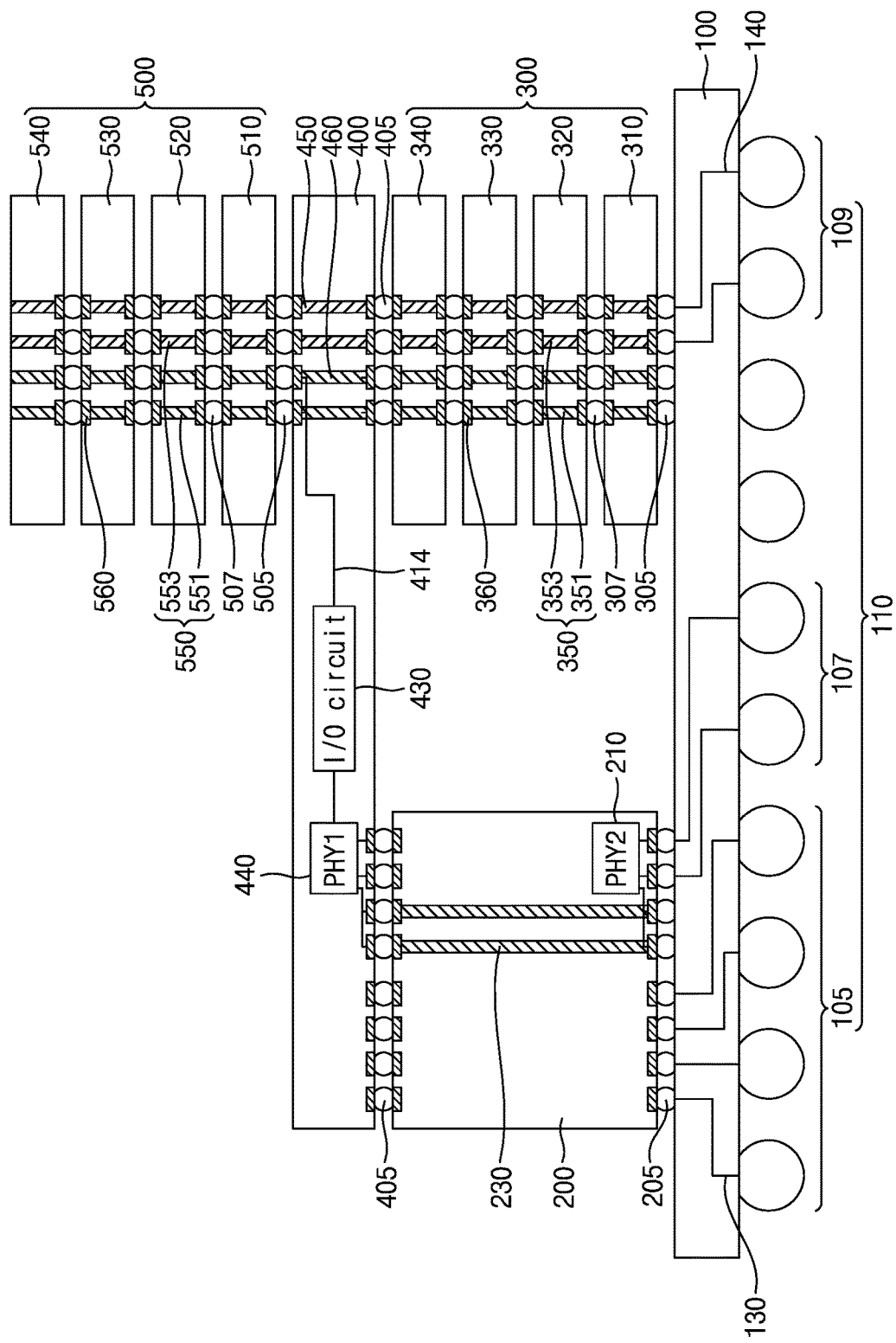
FIG. 11 is a cross-sectional view illustrating a semiconductor package according to an embodiment of the disclosure.

FIG. 11 is a cross-sectional view illustrating a semiconductor package according to an embodiment of the disclosure.

Referring to FIG. 11, in an embodiment, an interposer 400 may include a data TSV 460. The data TSV 460 may be aligned at a position that vertically corresponds to an upper data TSV 551 of an upper memory 500 and a lower data TSV 351 of a lower memory 300. The data TSV 460 may be electrically connected to the upper data TSV 551 of the upper memory 500 and the lower data TSV 351 of the lower memory 300. The data TSV 460 may be electrically insulated from the power TSV 450. A wiring layer 414 may electrically connect the data TSV 460 to an I/O circuit 430. The wiring layer 414 may be connected to a pad connected to the data TSV 460 to electrically connect the data TSV 460 to the I/O circuit 430.

Figure 12:
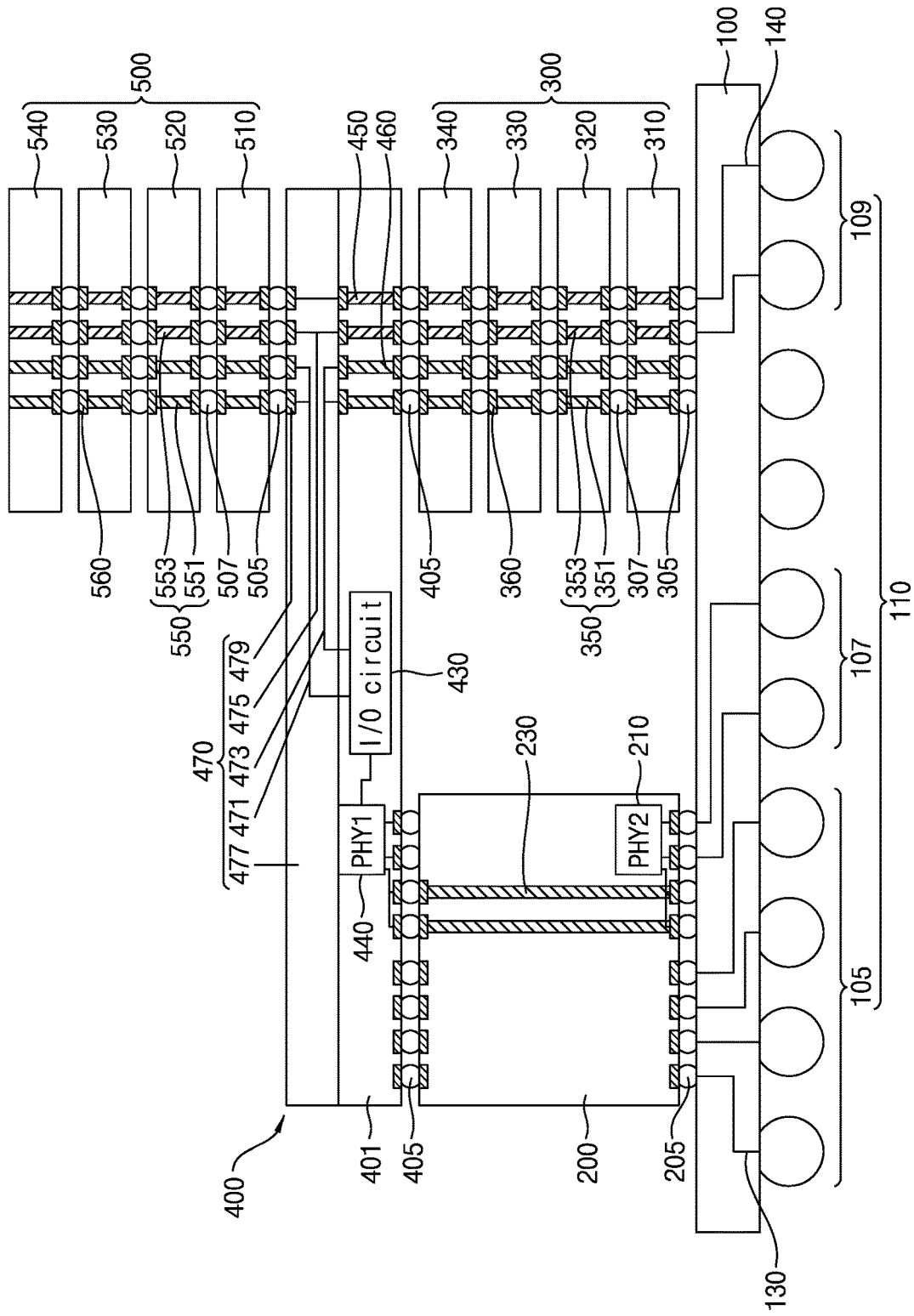
FIG. 12 is a cross-sectional view illustrating a semiconductor package according to an embodiment of the disclosure.

FIG. 12 is a cross-sectional view illustrating a semiconductor package according to an embodiment of the disclosure.

Referring to FIG. 12, in an embodiment, an interposer 400 may include a silicon substrate 401 and a redistribution layer 470. An I/O circuit 430 and a first PHY 440 may be disposed in the silicon substrate 401. A plurality of TSVs 450 and 460 may pass through the silicon substrate 401. The plurality of TSVs 450 and 460, as in FIG. 9A, may include a power TSV 450 and a data TSV 460, that pass through the silicon substrate 401 of the interposer 400.

The redistribution layer 470 may electrically connect the first PHY 440 to the lower memory 300 and/or the upper memory 500. The redistribution layer 470 may electrically connect the first PHY 440 to the lower memory 300 and/or the upper memory 500 through the I/O circuit 430. The redistribution layer 470 may be disposed on the silicon substrate 401 of the interposer 400. For example, the redistribution layer 470 may be disposed between the silicon substrate 401 of the interposer 400 and the upper memory 500. The redistribution layer 470 may cover a top surface of the silicon substrate 401 of the interposer 400. The redistribution layer 470 may include a plurality of redistribution patterns 471, 473, and 475 and a passivation layer 477. The redistribution layer 470 may further include a pad 479 exposed at a top surface of the passivation layer 477. The pad 479 may be electrically connected to the upper TSV 550 of the upper memory 500 through a solder bump 505. The plurality of redistribution patterns 471, 473, and 475 may include a metal of, or a metal alloy of, at least one metal selected from the group consisting of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C). The passivation layer 477 may include an insulating material, and for example, may include silicon nitride, silicon oxide, or silicon oxynitride. For example, the passivation layer 477 may include a polyimide-based material such as photosensitive polyimide (PSPI).

The redistribution layer 470 may include first to third redistribution patterns 471, 473, and 475. The first redistribution pattern 471 may be connected to the pad 479 of the redistribution layer 470, may extend in the passivation layer 477 and may be connected to the I/O circuit 430, and may be electrically connected to the upper memory 500 and the I/O circuit 430. For example, the first redistribution pattern 471 may be a data line through which a data signal passes, and the first redistribution pattern 471 may be connected to the pad 479 corresponding to the upper data TSV 551 of the upper memory 500 and may be electrically connected to the upper data TSV 551.

The second redistribution pattern 473 may be connected to a pad of the interposer 400, may extend in the passivation layer 477 and may be connected to the I/O circuit 430, and may be electrically connected to the lower memory 300 and the I/O circuit 430. For example, the second redistribution pattern 473 may be a data line through which a data signal passes, and the second redistribution pattern 473 may be connected to the pad corresponding to the lower data TSV 351 of the lower memory 300 and may be electrically connected to the lower data TSV 351. The second redistribution pattern 473 may be electrically insulated from the first redistribution pattern 471. In an embodiment, the second redistribution pattern 473 may be electrically connected to the first redistribution pattern 471.

The third redistribution pattern 475 may electrically connect the pad of the interposer 400 to the pad 479 of the redistribution layer 470. For example, the third redistribution pattern 475 may be connected to the pad of the interposer 400 corresponding to the lower power TSV 353 and may be connected to the pad 479 of the redistribution layer 470 corresponding to the upper power TSV 553, and thus, may electrically connect the lower power TSV 353 to the upper power TSV 553. In an embodiment, the third redistribution pattern 475 may have a line shape that extends vertically and rectilinearly.

Figure 13:
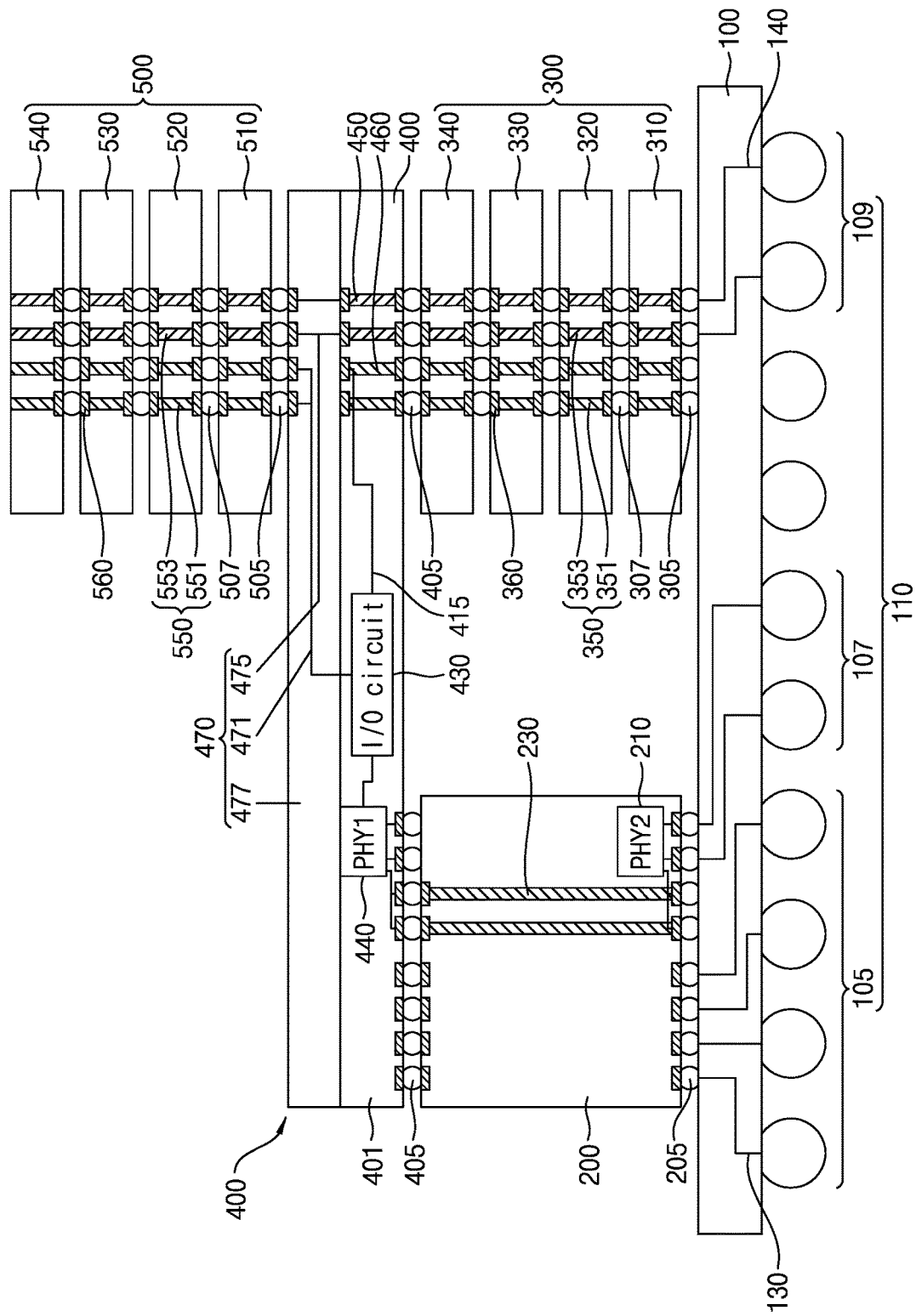
FIG. 13 is a cross-sectional view illustrating a semiconductor package according to an embodiment of the disclosure.

FIG. 13 is a cross-sectional view illustrating a semiconductor package according to an embodiment of the disclosure.

Referring to FIG. 13, an interposer 400 may include a wiring layer 415 that connects a lower data TSV 351 to an I/O circuit 430 of a silicon substrate 401. The interposer 400 may include a redistribution layer 470 disposed on the silicon substrate 401. The redistribution layer 470 may include a first redistribution pattern 471 that connects an upper data TSV 551 to the I/O circuit 430 and a third redistribution pattern 475 that connects an upper power TSV 553 to a lower power TSV 353, and the second redistribution pattern 473 described above with reference to FIG. 12 may be omitted.

Figure 14:
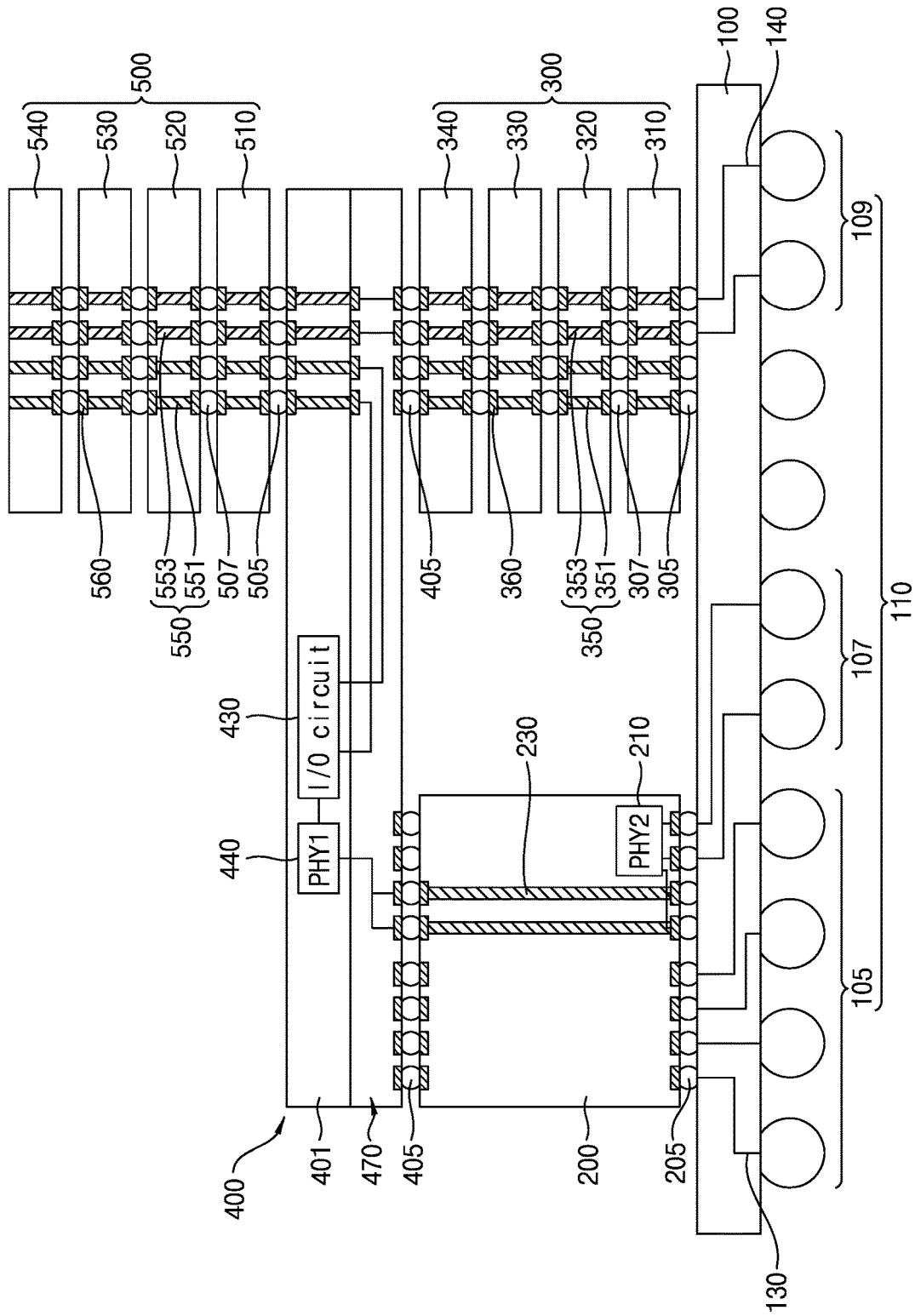
FIG. 14 is a cross-sectional view illustrating a semiconductor package according to an embodiment of the disclosure.

FIG. 14 is a cross-sectional view illustrating a semiconductor package according to an embodiment of the disclosure.

Referring to FIG. 14, a redistribution layer 470 may be disposed under a silicon substrate 401 of an interposer 400. For example, the redistribution layer 470 may be disposed between a processor 200 and the silicon substrate 401 and between a lower memory 300 and the silicon substrate 401. In this case, the redistribution layer 470 may further include a redistribution pattern that electrically connects a first PHY 440 to the processor 200.

Figure 15:
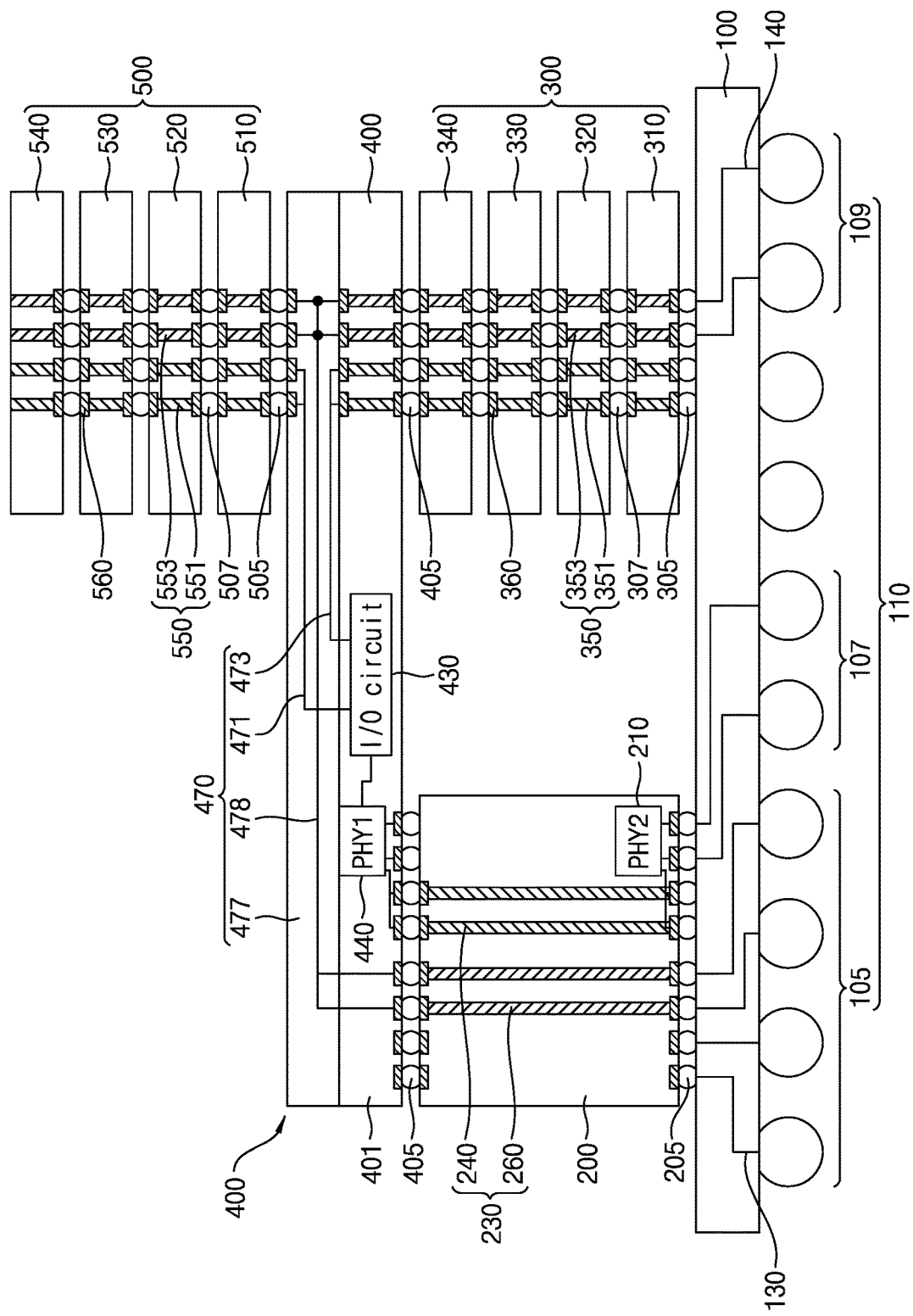
FIG. 15 is a cross-sectional view illustrating a semiconductor package according to an embodiment of the disclosure.

FIG. 15 is a cross-sectional view illustrating a semiconductor package according to an embodiment of the disclosure.

Referring to FIG. 15, a TSV 230 of a processor 200 may include a data TSV 240 and a power TSV 260. An interposer 400 may include a redistribution layer 470, and for example, the redistribution layer 470 may include a first redistribution pattern 471 that electrically connects an upper data TSV 551 to an I/O circuit 430 of the interposer 400, a second redistribution pattern 473 that electrically connects the I/O circuit 430 to a lower data TSV 351, and a third redistribution pattern 478 that electrically connects a power TSV 260 of a processor 200 to an upper power TSV 553 and a lower power TSV 353.

Figure 16:
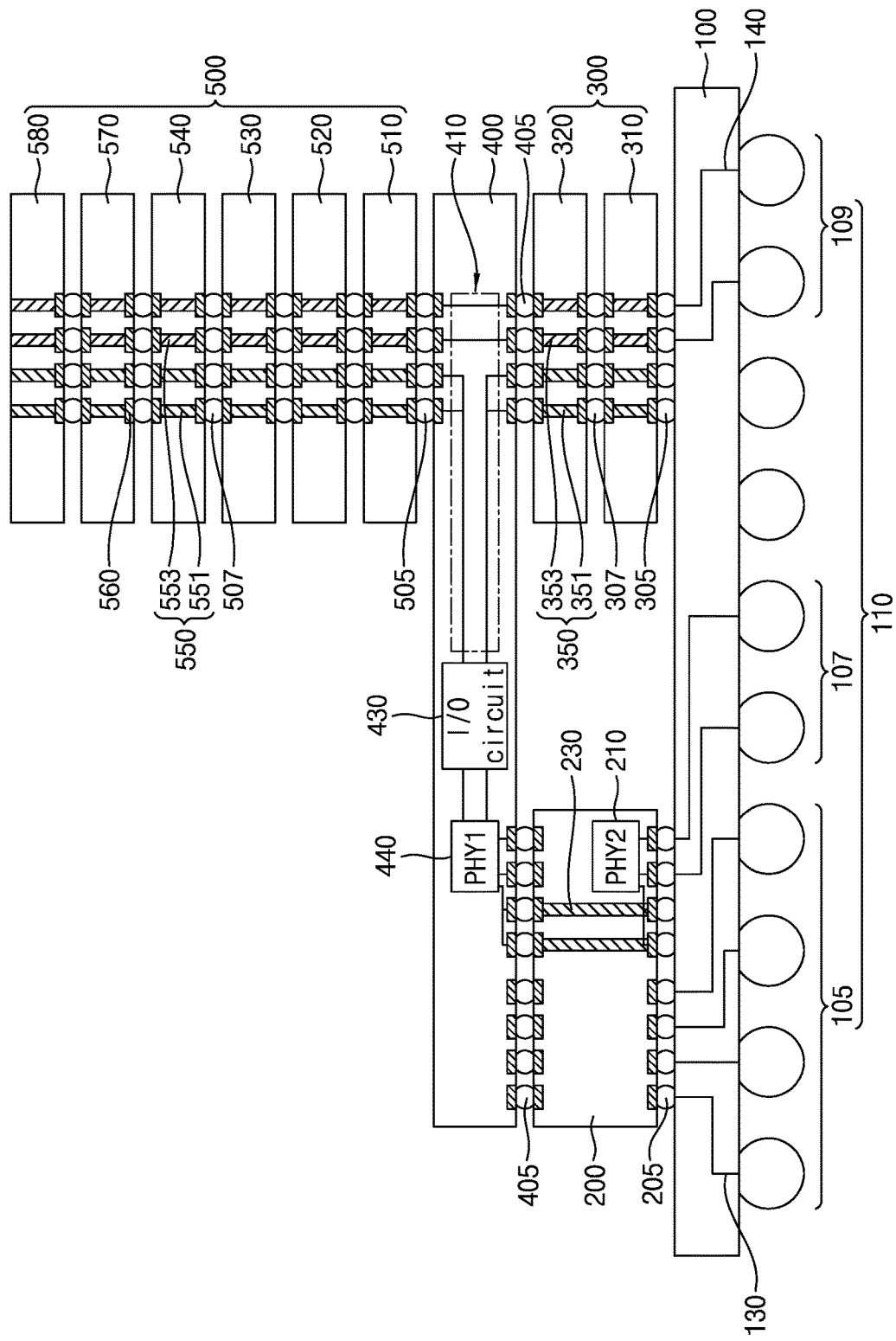
FIGS. 16 and 17 are cross-sectional views illustrating a semiconductor package according to embodiments of the disclosure.
Figure 17:
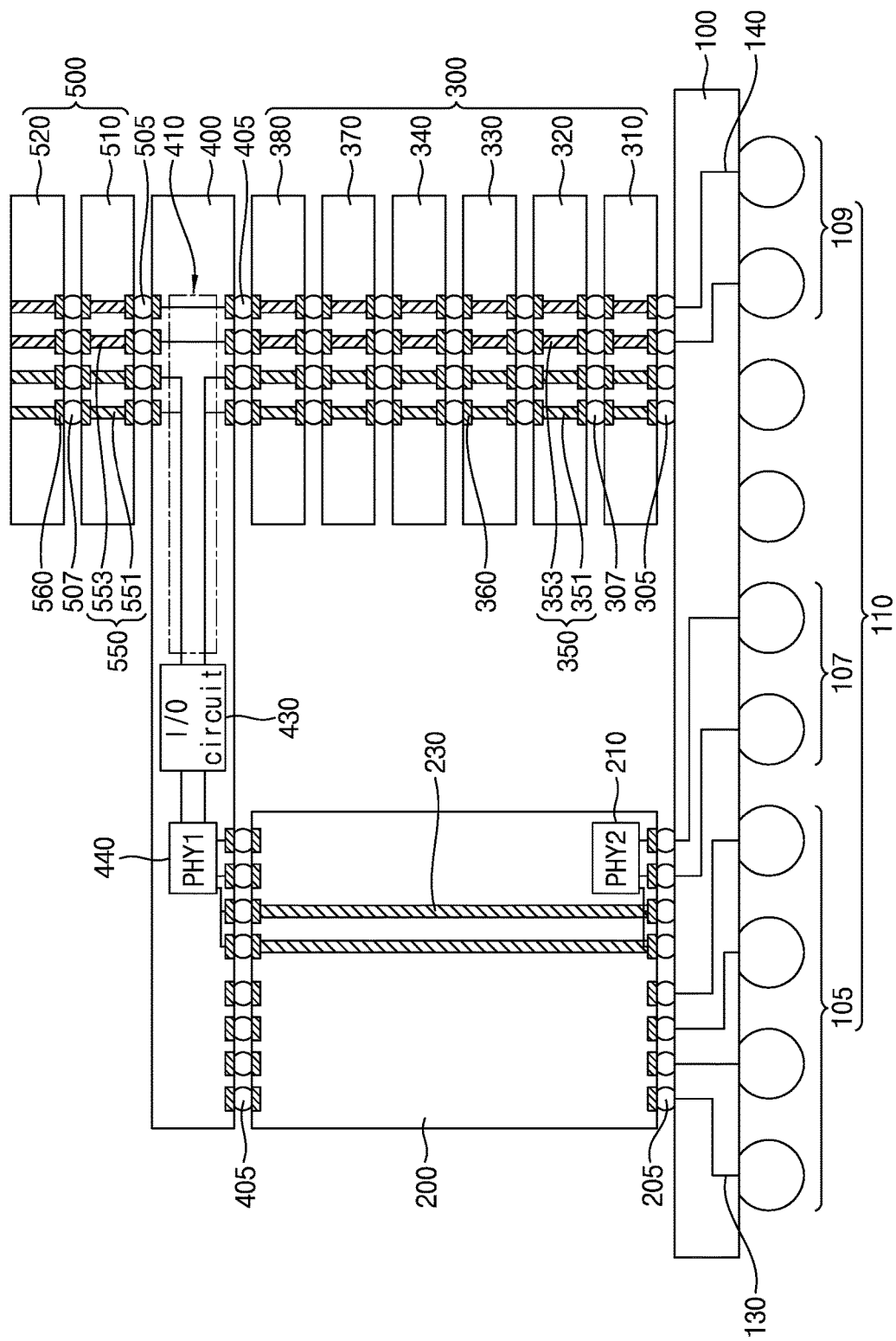

FIGS. 16 and 17 are cross-sectional views illustrating a semiconductor package according to embodiments of the disclosure.

Referring to FIGS. 16 and 17, an interposer 400 may be disposed on a processor 200 and a lower memory 300, and an upper memory 500 may be disposed on the interposer 400. The lower memory 300 may include a plurality of lower memory chips, and the upper memory 500 may include a plurality of upper memory chips. In an embodiment, the number of lower memory chips disposed under the interposer 400 may differ from the number of upper memory chips disposed on the interposer 400. For example, as in FIG. 16, the number of lower memory chips 310 and 320 may be less than the number of upper memory chips 510, 520, 530, 540, 570, and 580. Alternatively, as in FIG. 17, the number of lower memory chips 310, 320, 330, 340, 370, and 380 may be greater than the number of upper memory chips 510 and 520. A level of a top surface of the processor 200 may be substantially the same as a level of a top surface of each of lower memory chips 320 and 360, disposed at an uppermost portion, of the lower memory 300.

Figure 18:
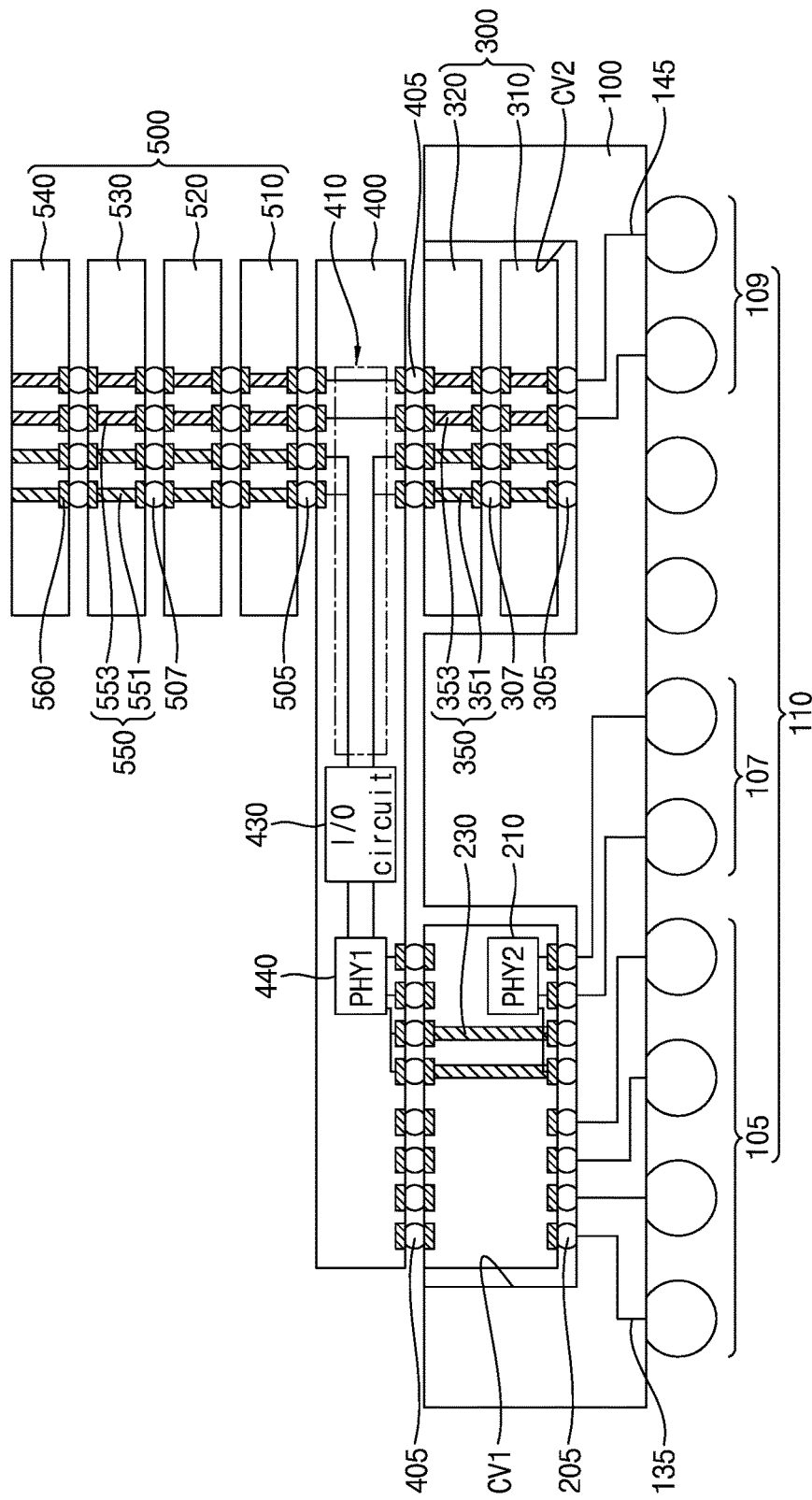
FIG. 18 is a cross-sectional view illustrating a semiconductor package according to an embodiment of the disclosure.

FIG. 18 is a cross-sectional view illustrating a semiconductor package according to an embodiment of the disclosure.

Referring to FIG. 18, a substrate 100 may include a first cavity CV1 and a second cavity CV2, that are recessed from a top surface thereof. At least a portion of a processor 200 may be disposed in the first cavity CV1 and may be mounted in the first cavity CV1 through a solder bump 205. A top surface of the processor 200 may be substantially the same as a top surface of the substrate 100. In an embodiment, only a lower portion of the processor 200 may be disposed in the first cavity CV1, and thus, an upper portion of the processor 200 may protrude from the substrate 100 and a top surface of the processor 200 may be disposed at a level that is higher than a top surface of the substrate 100. At least a portion of a lower memory 300 may be disposed in the second cavity CV2 and may be mounted in the substrate 100 through a solder bump 305. A top surface of a lower memory chip 320 disposed at an uppermost portion in the lower memory 300 may be disposed at the same level as a top surface of the processor 200. All of a plurality of lower memory chips may be disposed in the second cavity CV2, or only some of the plurality of lower memory chips may be disposed in the second cavity CV2 and some other lower memory chips may be disposed at a level that is higher than a top surface of the substrate 100.

A plurality of wiring layers 135 and 145 may be disposed under the first cavity CV1 and the second cavity CV2 of the substrate 100, a connection terminal 110 disposed under the substrate 100 may be electrically connected to the processor 200 through the wiring layers 135 and 145, and the connection terminal 110 may be electrically connected to the lower memory 300. An interposer 400 may be disposed on the substrate 100, the processor 200, and the lower memory 300. The interposer 400 may be mounted on the processor 200 and the lower memory 300 through a solder bump 405. An upper memory 500 may be mounted on the interposer 400 through a solder bump 505. The upper memory 500 may vertically overlap the lower memory 300.

Figure 19:
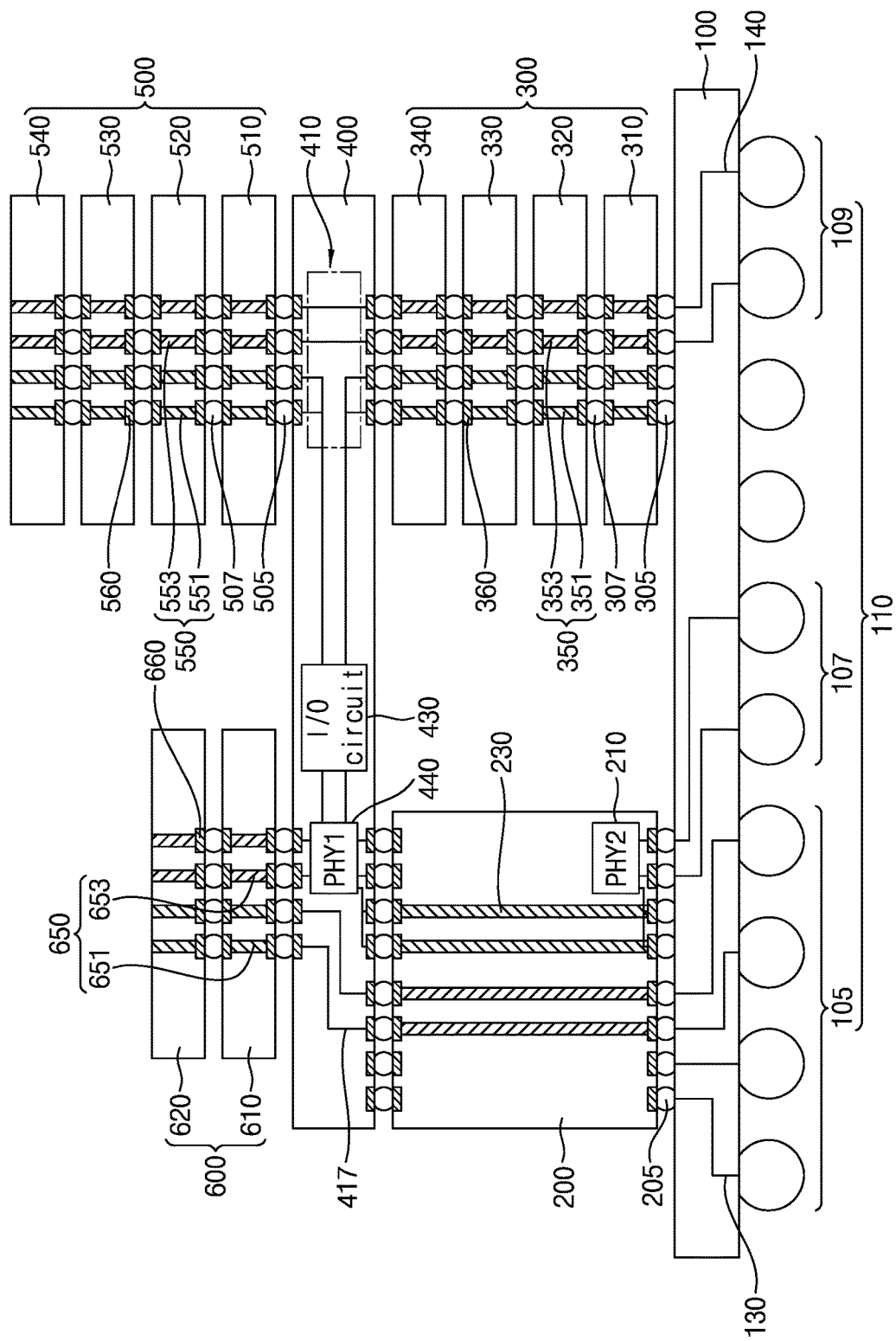
FIGS. 19 and 20 are cross-sectional views illustrating a semiconductor package according to embodiments of the disclosure.
Figure 20:
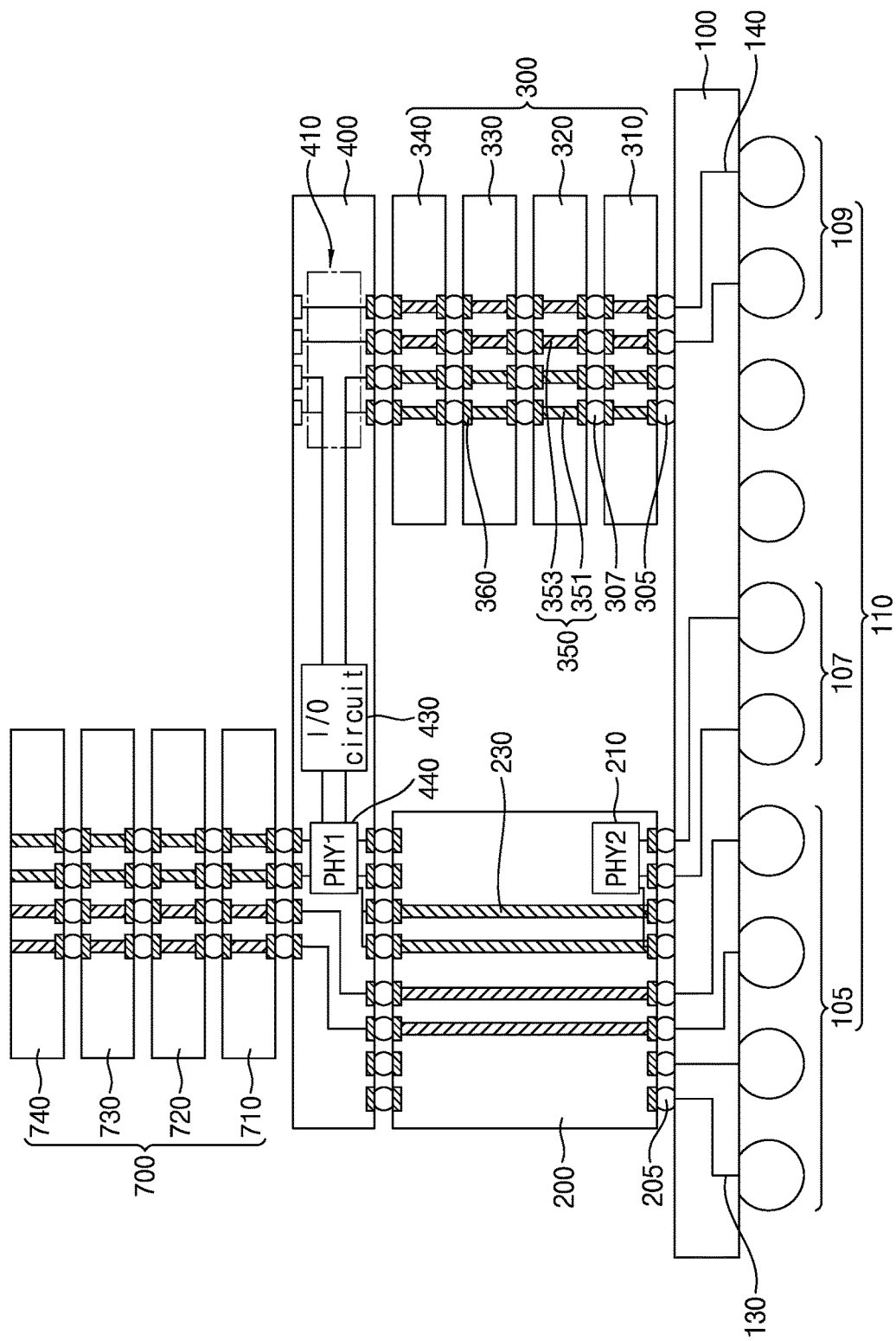

FIGS. 19 and 20 are cross-sectional views illustrating a semiconductor package according to embodiments of the disclosure.

Referring to FIG. 19, a semiconductor package may include a first upper memory 500 and a second upper memory 600, that are disposed on an interposer 400. The first upper memory 500 may vertically overlap a lower memory 300, and the second upper memory 600 may vertically overlap a processor 200. The first upper memory 500 may include a plurality of first upper memory chips 510, 520, 530, and 540 that are vertically stacked, and the second upper memory 600 may include a plurality of second upper memory chips 610 and 620 that are vertically stacked. The plurality of first upper memory chips 510, 520, 530, and 540 and the plurality of second upper memory chips 610 and 620 may be the same memory chips. The number of first upper semiconductor chips may be the same as or different from the number of second upper semiconductor chips.

Each of the plurality of second upper memory chips 610 and 620 may include a TSV 650 and a pad 660. The TSV 650 may include a data TSV 651 and a power TSV 653. The data TSV 651 of each of the plurality of second upper memory chips 610 and 620 may be electrically connected to an I/O circuit 430 and/or a first PHY 440 of an interposer 400, and the power TSV 651 may be electrically connected to a power TSV 260 of the processor 200 through a redistribution layer or a wiring layer 417 of the interposer 400.

Referring to FIG. 20, in an embodiment, a semiconductor package may include a second upper memory chip 700 that vertically overlaps a processor 200. A first upper memory 500 (see FIG. 19) on a lower memory 300 may be omitted.

Figure 21:
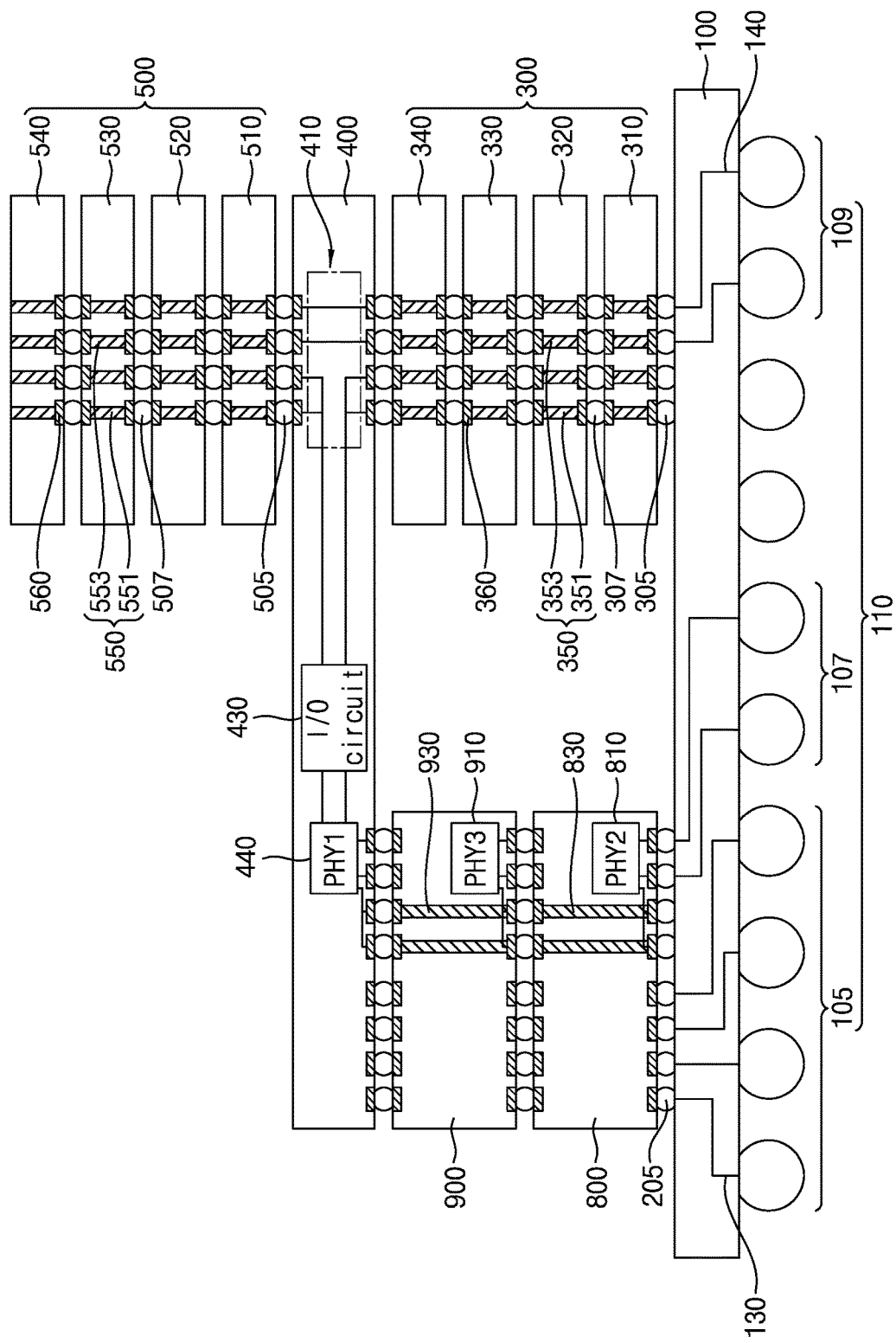
FIG. 21 is a cross-sectional view illustrating a semiconductor package according to an embodiment of the disclosure.

FIG. 21 is a cross-sectional view illustrating a semiconductor package according to an embodiment of the disclosure.

Referring to FIG. 21, the semiconductor package may include a plurality of processors 800 and 900. In an embodiment, the semiconductor package may include a first processor 800 and a second processor 900. The first processor 800 and the second processor 900 may be vertically stacked. An interposer 400 may be mounted on the second processor 900. A level of a top surface of the second processor 900 may be substantially the same as a level of a top surface of a fourth lower memory chip 340 disposed at an uppermost portion among a plurality of lower memory chips of the lower memory 300. The first processor 800 and the second processor 900 may be the same kind of ASICs. In an embodiment the first processor 800 and the second processor 900 may be the different kind of ASICs.

The first processor 800 may include a second PHY 810 and a first TSV 830, and the second processor 900 may include a third PHY 910 and a second TSV 930. The first TSV 830 may electrically connect the second PHY 810 to the third PHY 910. The second TSV 930 may electrically connect the first PHY 440 to the third PHY 910. The first TSV 830 may be electrically connected to the second TSV 930. The first processor 800 and the second processor 900 may communicate with each other through the second PHY 810 and the third PHY 910. The first processor 800 may communicate with an upper memory 500 and/or a lower memory 300 through the first PHY 440 and the second PHY 810. The second processor 900 may communicate with the upper memory 500 and/or the lower memory 300 through the third PHY 910 and the first PHY 440.

In an embodiment, at least one of the first to third PHYs 440, 810, and 910 may be disposed in an edge region of the first and second processors 800 and 900. In an embodiment, the first PHY 440 may vertically overlap at least one of a second PHY 810 and a third PHY 910.

Figure 22:
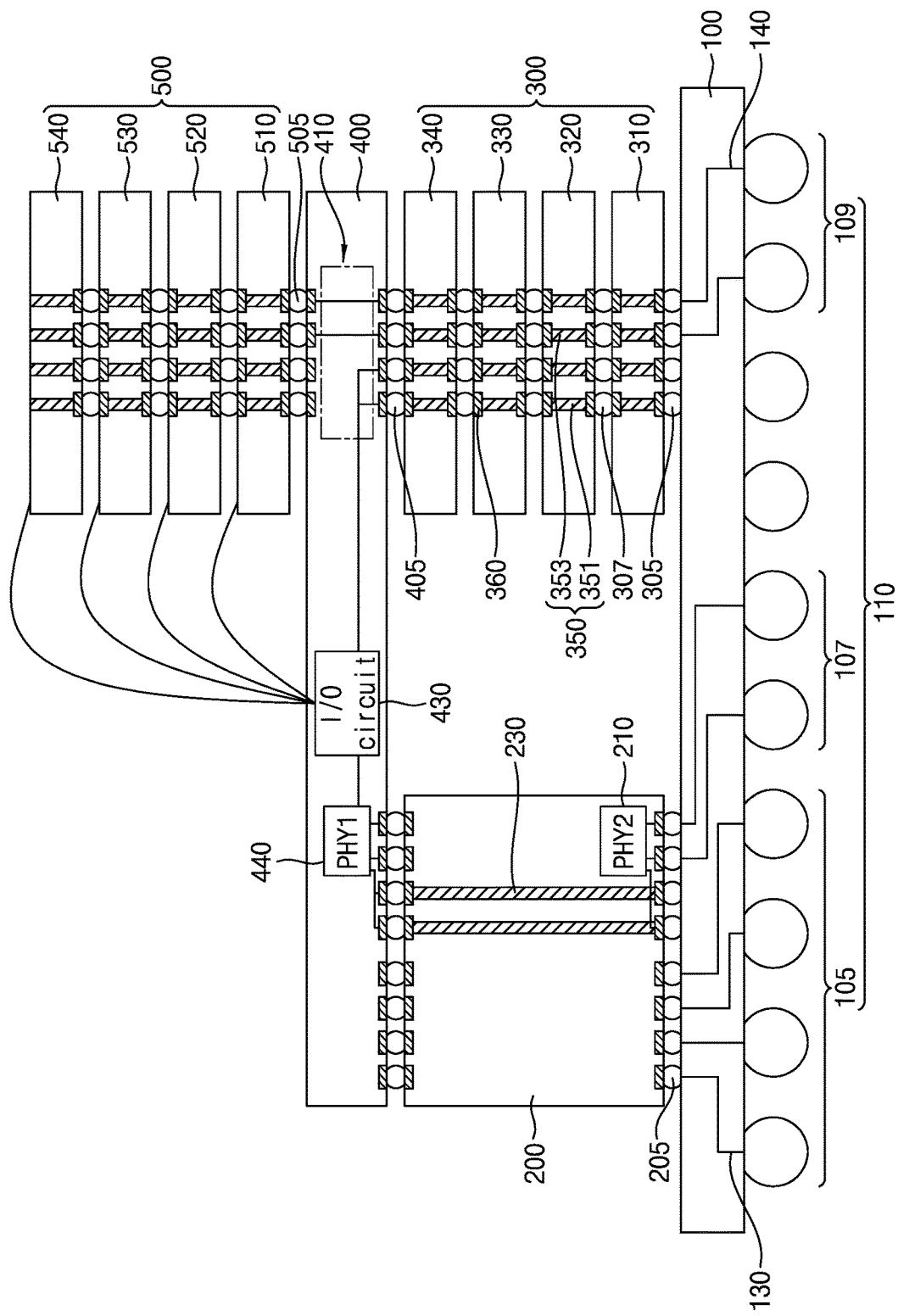
FIG. 22 is a cross-sectional view illustrating a semiconductor package according to an embodiment of the disclosure.

FIG. 22 is a cross-sectional view illustrating a semiconductor package according to an embodiment of the disclosure.

Referring to FIG. 22, a plurality of upper memory chips 510, 520, 530, and 540 may be electrically connected to an interposer 400 in a wire bonding manner. For example, each of the plurality of upper memory chips 510, 520, 530, and 540 may transmit or receive a data signal through a wire electrically connected to a first PHY 440 and/or an I/O circuit of the interposer 400. Each of the plurality of upper memory chips 510, 520, 530, and 540 may receive the data signal through an upper data TSV 551 electrically connected to a routing circuit 410 of the interposer 400 and may receive a power signal through an upper power TSV 553. In an embodiment, an upper memory 500 may include the plurality of upper memory chips 510, 520, 530, and 540, and each of the plurality of upper memory chips 510, 520, 530, and 540 might not include a TSV 530. In this case, the plurality of upper memory chips 510, 520, 530, and 540 may receive the data signal and/or the power signal through the wire connected to the interposer 400.

The semiconductor package according to an embodiment of the disclosure may be implemented as a type such as a system in package, a multi-chip package, or a system on chip, or may be implemented as a package on package type including a plurality of packages.

According to the embodiments of the disclosure, because an interposer for performing a function of a buffer chip is disposed between a plurality of vertically stacked memory chips, a physical distance difference between the interposer and each of the memory chips may be minimized, and thus, electrical characteristic loss may decrease. A physical layer included in the interposer and a physical layer of a processor may be connected to each other through a TSV within a shortest distance, and thus, an electrically optimized topology may be provided, thereby enhancing a communication speed between the processor and each memory chip. Because the interposer includes a redistribution layer and a TSV, a wiring process between the processor and each memory chip may be easily performed, and electrical characteristic loss occurring in a signal transfer process performed in the interposer may be minimized.

Hereinabove, the embodiments of the disclosure have been described with reference to the accompanying drawings, but it may be understood that those skilled in the art may implement the embodiments in another detailed form without changing the inventive concept or the essential feature. It should be understood that the embodiments described above may be examples and the present invention is not necessarily limited to the elements of the examples set forth herein.

What is claimed is:

1. A semiconductor package, comprising:
a processor,
a first memory including a plurality of first memory chips;
an interposer disposed over the processor and the first memory; and
a second memory disposed over the interposer, the second memory including a plurality of second memory chips,
wherein the interposer is disposed between the first memory and the second memory,
wherein the interposer comprises a first physical layer (PHY) transmitting and receiving a signal between the processor and the first memory and transmitting and receiving a signal between the processor and the second memory,
wherein the processor comprises a second PHY communicating with the first PHY,
wherein a first through silicon via (TSV) electrically connects the first PHY to the second PHY,
wherein each of the plurality of first memory chips comprises:
a first data TSV receiving a data signal, received from the processor, through the first PHY; and
a first power TSV receiving a power signal from a first substrate, and
wherein each of the plurality of second memory chips comprises:
a second data TSV receiving a data signal, received from the processor, through the first PHY; and
a second power TSV receiving the power signal from the first power TSV.

2. The semiconductor package of claim 1, wherein a number of memory chips of the plurality of first memory chips of the first memory is the same as a number of memory chips of the plurality of second memory chips of the second memory.

3. The semiconductor package of claim 1, wherein a number of memory chips of the plurality of first memory chips of the first memory differs from a number of memory chips of the plurality of second memory chips of the second memory.

4. The semiconductor package of claim 1, wherein the interposer further comprises a power TSV electrically connecting the first power TSV to the second power TSV.

5. The semiconductor package of claim 1, wherein the interposer further comprises a data TSV electrically connecting the first data TSV to the second data TSV.

6. The semiconductor package of claim 1, wherein the interposer further comprises:
a second substrate including the first PHY; and
a redistribution layer disposed on the second substrate, and
wherein the redistribution layer comprises:
a first redistribution pattern transferring the data signal between the second data TSV and the first PHY;
a second redistribution pattern transferring the data signal between the first data TSV and the first PHY;
a third redistribution pattern transferring the power signal between the first power TSV and the second power TSV; and
a passivation layer at least partially covering the first redistribution pattern, the second redistribution pattern, and the third redistribution pattern.

7. The semiconductor package of claim 1, wherein the processor further comprises a second TSV receiving a power signal through a substrate.

8. The semiconductor package of claim 7, wherein the second TSV transfers the power signal to the second power TSV through the interposer.

9. The semiconductor package of claim 1, wherein the interposer further comprises at least one repeater compensating for loss of signal integrity of the signal.

10. The semiconductor package of claim 1, wherein the second PHY is disposed in an edge region adjacent to the first memory of the processor.

11. The semiconductor package of claim 10, wherein the first PHY vertically at least partially overlaps the second PHY.

12. The semiconductor package of claim 10, wherein the first TSV is disposed adjacent to the second PHY.

13. The semiconductor package of claim 12, wherein the first PHY at least partially vertically overlaps the first TSV.

14. A semiconductor package, comprising:
a processor disposed on a substrate;
a lower memory including a plurality of lower memory chips;
an upper memory including a plurality of upper memory chips which are vertically stacked; and
an interposer disposed between the lower memory and the upper memory,
wherein the interposer comprises:
a first physical layer (PHY) transmitting and receiving a signal between the processor and the lower memory and transmitting and receiving a signal between the processor and the upper memory;
a power through silicon via (TSV) passing through the interposer, receiving a power signal from the lower memory, and transferring the power signal to the upper memory; and
a data TSV passing through the interposer, receiving a data signal from the lower memory or the upper memory, and transferring the data signal to the first PHY,
wherein the processor comprises:
a second PHY communicating with the first PHY; and
a TSV electrically connecting the first PHY to the second PHY, and
the first PHY vertically overlaps the second PHY.

15. The semiconductor package of claim 14, wherein the interposer further comprises:
an interposer substrate including the first PHY; and
a redistribution layer disposed on the interposer substrate and electrically connecting the first PHY to the data TSV.

16. The semiconductor package of claim 15, wherein the redistribution layer is disposed between the interposer substrate and the upper memory.

17. The semiconductor package of claim 15, wherein the redistribution layer is disposed between the interposer substrate and the lower memory.

18. A semiconductor package, comprising:
a processor disposed on a substrate;
a lower memory including a plurality of lower memory chips vertically stacked on the substrate;
an interposer disposed on the processor and the lower memory; and
a first upper memory disposed on the interposer, the first upper memory including a plurality of upper memory chips that are vertically stacked,
wherein the interposer comprises:
a first physical layer (PHY) electrically connected to the processor, the first upper memory, and the lower memory;
a redistribution layer electrically connecting the lower memory to the first PHY and electrically connecting the first upper memory to the first PHY; and
a power through silicon via (TSV) passing through the interposer, receiving a power signal from the lower memory, and transferring the power signal to the first upper memory,
wherein the processor comprises:
a second PHY communicating with the first PHY;
a first TSV electrically connecting the first PHY to the second PHY; and
a second TSV receiving a power signal from the substrate and transferring the power signal to the power TSV, and
wherein the first PHY at least partially vertically overlaps the second PHY.

19. The semiconductor package of claim 18, wherein
the first upper memory at least partially vertically overlaps the lower memory, and
the semiconductor package further comprises a second upper memory at least partially vertically overlapping the processor on the interposer.

* * * * *